(12) United States Patent
Bando et al.

(10) Patent No.: US 11,437,429 B2
(45) Date of Patent: Sep. 6, 2022

(54) LIGHT EMITTING DEVICE

(71) Applicant: NICHIA CORPORATION, Anan (JP)

(72) Inventors: Shimpei Bando, Anan (JP); Koki Shibai, Anan (JP)

(73) Assignee: NICHIA CORPORATION, Anan (JP)

( * ) Notice: Subject to any disclaimer, the term of this patent is extended or adjusted under 35 U.S.C. 154(b) by 3 days.

(21) Appl. No.: 17/033,400

(22) Filed: Sep. 25, 2020

(65) Prior Publication Data

US 2021/0098664 A1  Apr. 1, 2021

(30) Foreign Application Priority Data

Sep. 30, 2019 (JP) ............................ JP2019-181023
Sep. 30, 2019 (JP) ............................ JP2019-181024

(51) Int. Cl.
| | |
|---|---|
| H01L 27/15 | (2006.01) |
| H01L 33/56 | (2010.01) |
| H01L 25/075 | (2006.01) |
| H01L 33/60 | (2010.01) |

(52) U.S. Cl.
CPC ........ *H01L 27/156* (2013.01); *H01L 25/0753* (2013.01); *H01L 33/56* (2013.01); *H01L 33/60* (2013.01)

(58) Field of Classification Search
CPC ... H01L 25/0753; H01L 27/156; H01L 33/56; H01L 33/60
See application file for complete search history.

(56) References Cited

U.S. PATENT DOCUMENTS

| | | | |
|---|---|---|---|
| 4,914,731 A | 4/1990 | Chen | |
| 2013/0322078 A1 | 12/2013 | Weekamp et al. | |
| 2017/0040514 A1 | 2/2017 | Yasuhara et al. | |
| 2019/0088824 A1* | 3/2019 | Kim | ........................ H01L 33/52 |

FOREIGN PATENT DOCUMENTS

| | | |
|---|---|---|
| JP | S6321692 A | 1/1988 |
| JP | 2001-85748 A | 3/2001 |
| JP | 2013540338 A | 10/2013 |
| JP | 2017-34119 A | 2/2017 |
| JP | 2018206553 A | 12/2018 |

(Continued)

*Primary Examiner* — Julio J Maldonado
*Assistant Examiner* — Molly K Reida
(74) *Attorney, Agent, or Firm* — Global IP Counselors, LLP

(57) ABSTRACT

A light emitting device includes a substrate, a plurality of light sources, a light reflecting member and a resin member. The substrate defines a through hole. The light reflecting member includes a wall part having a first surface and a second surface. The first surface defines a plurality of surrounding parts respectively surrounding each of the light sources individually or two or more of the light sources in groups. The second surface defines a hollow part. The resin member is disposed inside the hollow part. The hollow part defines a first opening on a substrate side of the wall part. The through hole defines a second opening positioned inner than the first opening. The resin member is continuously in contact with the second surface and the upper surface of the substrate in a region between a peripheral edge of the second opening and a peripheral edge of the first opening.

9 Claims, 18 Drawing Sheets

(56) References Cited

FOREIGN PATENT DOCUMENTS

| JP | 2019040874 | A  | 3/2019  |
|----|------------|----|---------|
| WO | 2012023459 | A1 | 2/2012  |
| WO | 2018084215 | A1 | 5/2018  |
| WO | 2018124012 | A1 | 7/2018  |
| WO | 2018221657 | A1 | 12/2018 |

\* cited by examiner

LIGHT EMITTING DEVICE

CROSS-REFERENCE TO RELATED APPLICATION

This application claims priority to Japanese Patent Application No. 2019-181023 filed on Sep. 30, 2019, and Japanese Patent Application No. 2019-181024 filed on Sep. 30, 2019, the disclosures of which are hereby incorporated herein by reference in their entireties.

BACKGROUND

The present disclosure relates to a light emitting device.

There has been proposed a backlight device in which a plurality of light sources and a reflecting member (reflector) provided with wall parts respectively surrounding the light sources are disposed on a substrate (see paragraph 0032 in WO 2012/023459).

There is demand for a light emitting device with good (or high) light extraction efficiency.

SUMMARY

The present disclosure includes the following embodiment.

According to an embodiment of the present disclosure, a light emitting device includes a substrate, a plurality of light sources, a light reflecting member and a resin member. The substrate defines a through hole penetrating through the substrate in a thickness direction. The light sources are disposed on the substrate. The light reflecting member is disposed on the substrate and including a wall part having a first surface and a second surface. The first surface defines a plurality of surrounding parts respectively surrounding each of the light sources individually or two or more of the light sources in groups. The second surface is on an opposite side of the first surface and defines a hollow part. The resin member is disposed inside the hollow part. The hollow part defines a first opening on a substrate side of the wall part. The through hole defines a second opening at an upper surface of the substrate, the second opening being positioned inner than the first opening in the top view. The resin member is continuously in contact with the second surface of the wall part defining the hollow part and the upper surface of the substrate in a region between a peripheral edge of the second opening and a peripheral edge of the first opening.

Furthermore, the present disclosure includes the following embodiment.

According to an embodiment of the present disclosure, a light emitting device includes a substrate, a plurality of light sources, and a plurality of light reflecting members. The light sources are disposed on the substrate. The light reflecting members are disposed on the substrate. The light reflecting members respectively include wall parts each surrounding each of the light sources individually or two or more of the light sources in groups. Two adjacent ones of the light reflecting members are joined to each other such that outer surfaces of the wall parts of the two adjacent ones of the light reflecting members are bonded to each other via an adhesive agent.

Certain embodiment of the present disclosure can provide a light emitting device with good (or high) light extraction efficiency.

DETAILED DESCRIPTION OF EMBODIMENTS

Figure 1A:
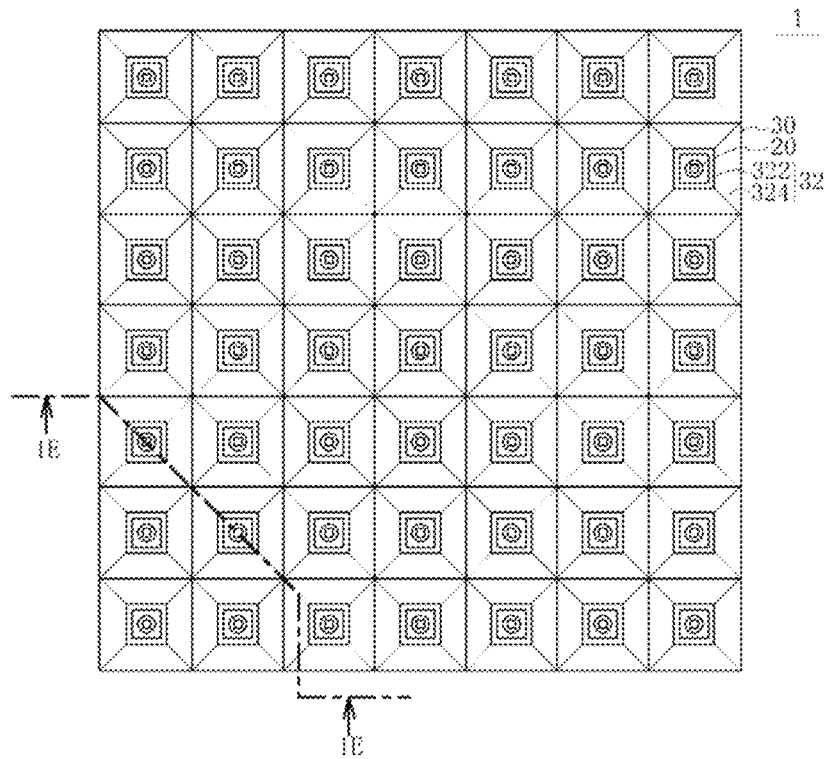
FIG. 1A is a schematic top view of a light emitting device according to a first embodiment.

In the following, with reference to the drawings, a detailed description will be given of a light emitting device of the present disclosure. The light emitting device according to the present disclosure is of an exemplary nature, and the present disclosure is not limited to the light emitting device described in the following. In the following description, the terms representing a specific direction or position can be used (for example, "upper", "lower", and any other terms including these terms). These terms are used just for facilitating understanding of relative direction or position in any drawings referred to. The size or positional relationship of constituent elements in the drawings can be exaggerated for the sake of clarity, without reflecting the size in the actual light emitting device or relative size among the constituent elements in the actual light emitting device. For easier understanding, the elements can be omitted from the drawings as appropriate.

Light Emitting Device 1 According to the First Embodiment

Figure 1B:
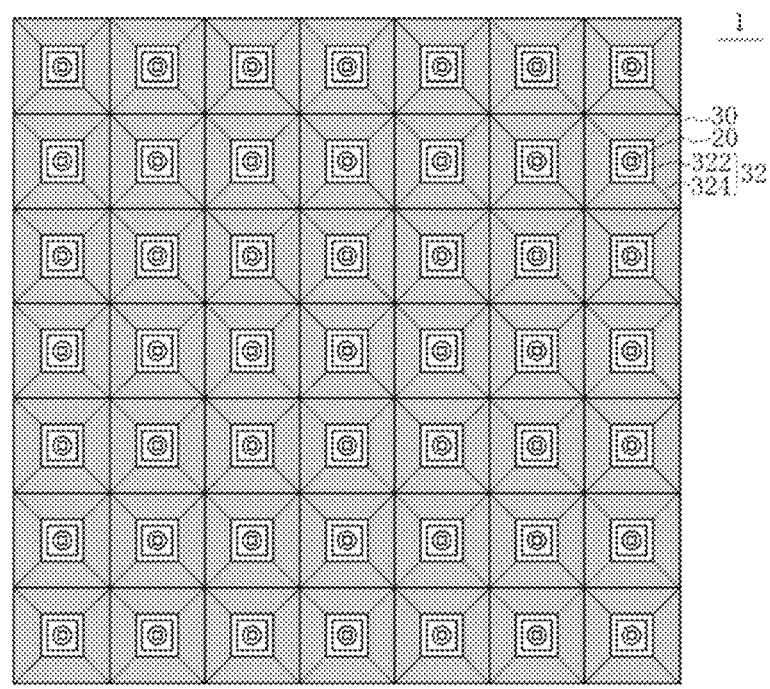
FIG. 1B corresponds to FIG. 1A in which a lateral surface part of the wall part is hatched.
Figure 1C:
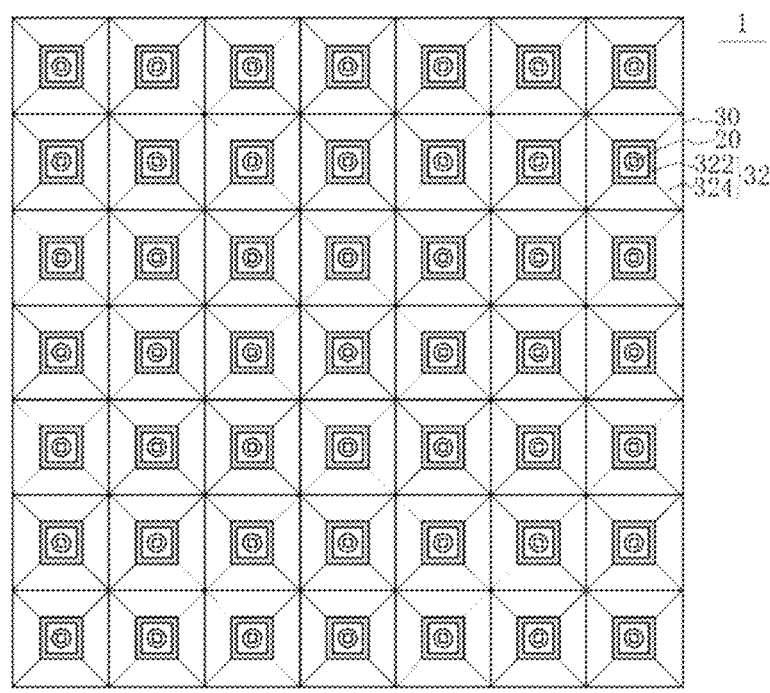
FIG. 1C corresponds to FIG. 1A in which a bottom surface part of the wall part is hatched.
Figure 1D:
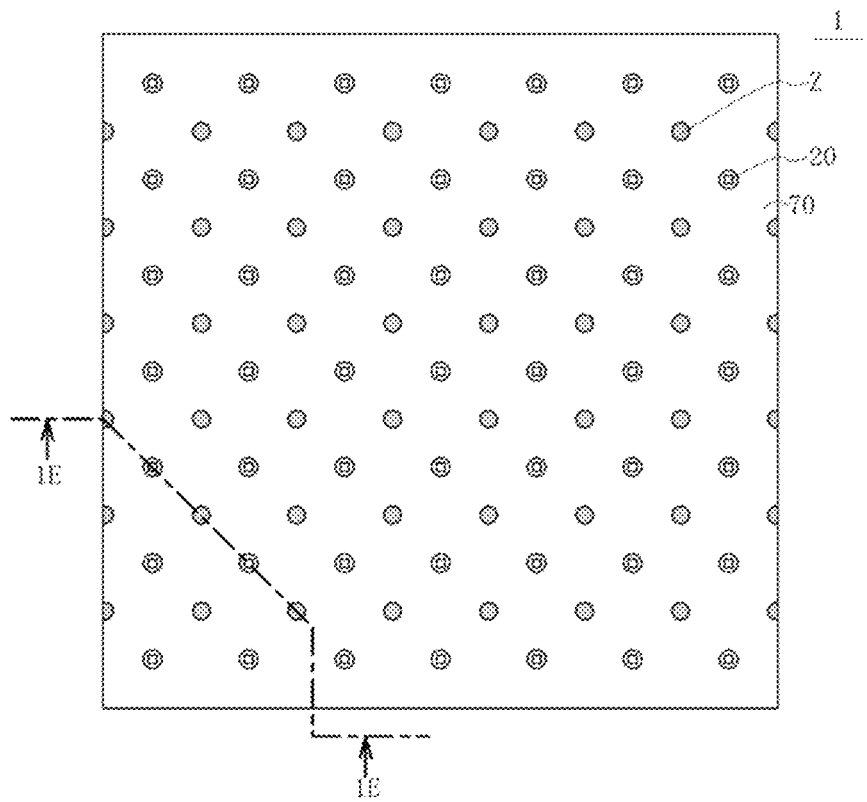
FIG. 1D shows the positional relationship between through holes (second openings) of a substrate and light sources.
Figure 1E:
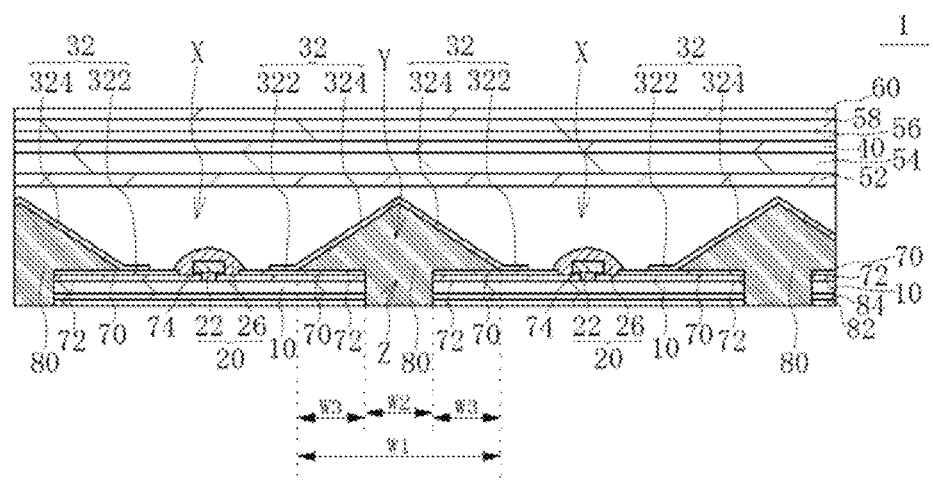
FIG. 1E is a cross-sectional view taken along line 1E-1E in FIG. 1A.

FIG. 1A is a schematic top view of a light emitting device according to a first embodiment. FIG. 1B corresponds to FIG. 1A in which a lateral surface part 324 of a wall part 32 is hatched. FIG. 1C corresponds to FIG. 1A in which a bottom surface part 322 of the wall part 32 is hatched. FIG. 1D shows the positional relationship between through holes (second openings) of a substrate and light sources. FIG. 1D does not show a light reflecting member 30 and an adhesive agent 80. FIG. 1E is a cross-sectional view taken along line 1E-1E in FIG. 1A. FIG. 1E shows also members disposed above the light emitting device 1.

As shown in FIGS. 1A to 1E, the light emitting device 1 according to the first embodiment is a light emitting device that includes a substrate 10, a plurality of light sources 20 disposed on the substrate 10, and a light reflecting member 30 disposed on the substrate 10 and including at least one wall part 32 surrounding one of the light sources 20 or the plurality of light sources 20. In the wall part 32, a hollow part Y formed with a first opening W1 on the substrate 10 side. In the substrate 10, a through hole Z penetrating through the substrate 10 in the top-bottom direction (the thickness direction) defines a second opening W2 positioned inner than the first opening W1 at the upper surface of the substrate 10. A resin member 80 is provided to be continuously in contact with the inner wall of the hollow part Y and a region W3 at the upper surface of the substrate 10 provided between the peripheral edge of the second opening W2 and the peripheral edge of the first opening W1. Details will be given in the following.

Substrate 10

The substrate 10 is a member for the plurality of light sources 20 to be disposed thereon.

The substrate 10 can be a flexible substrate that can be manufactured by the roll-to-roll scheme or a rigid substrate, for example. The rigid substrate can be a thin rigid substrate that can be bent.

The material of the substrate 10 can be, for example, ceramic or resin such as phenolic resin, epoxy resin, polyimide resin, BT resin, polyphthalamide (PPA), or polyethylene terephthalate (PET). The ceramic can be, for example, alumina, mullite, forsterite, glass ceramic, nitride-based ceramic (for example, AlN), carbide-based ceramic (for example, SiC), or LTCC. In using resin, the resin can be mixed with inorganic filler such as glass fibers, $SiO_2$, $TiO_2$, or $Al_2O_3$, to improve mechanical strength, reduce thermal expansion coefficient, and improve light reflectivity. It is also possible to use a metal substrate that includes a metal member and an insulating layer formed on the metal member.

The thickness of the substrate 10 can be selected as appropriate.

The upper surface of the substrate 10 is preferably a plane so as to facilitate disposing the light reflecting member 30. The plane includes a substantially flat plane. The shape of the substrate 10 as seen in a top view can be a square, a rectangular, or a circular shape. The square, the rectangular, and the circular shapes respectively include a substantially square, a substantially rectangular, and a substantially circular shapes.

In the substrate 10, the through hole Z penetrating through the substrate 10 in the top-bottom direction is defined. Thus, through the through hole Z from the lower surface side of the substrate 10, the resin member 80 (an adhesive agent 80 according to a third embodiment which will be described later) can be injected into the hollow part Y of the wall part 32 of the light reflecting member 30. The through hole Z defines the second opening W2 at the upper surface of the substrate 10. Through the second opening W2, the through hole Z communicates with the hollow part Y of the wall part 32 of the light reflecting member 30. The inner diameter, shape and other conditions of the through hole Z are not limited to specific inner diameter, shape and conditions, so long as the resin member 80 (the adhesive agent 80 according to the third embodiment which will be described later) can be injected into the hollow part Y. The second opening W2 (the outer edge of the second opening W2) is positioned inner than the first opening W1 (the outer edge of the first opening W1). Accordingly, the region W3 can be provided at the upper surface of the substrate 10 and between the peripheral edge of the second opening W2 and the peripheral edge of the first opening W1. This can allow the resin member 80 (the adhesive agent 80 according to the third embodiment which will be described later) to be continuously in contact with the region W3 and the inner wall of the hollow part Y. For example, in the case in which the thickness of the substrate 10 is 0.5 mm and the diameter of the first opening W1 is 3 mm, the diameter of the second opening W2 is 1 mm. In this case, the region W3 at the upper surface of the substrate 10 formed between the peripheral edge of the second opening W2 and the peripheral edge of the first opening W1 is provided on each of the right and left sides of the second opening W2 as seen in a cross-sectional view, by a length of 1 mm. That is, for example, as seen in a cross-sectional view, the following relationship is established: (the length of the region W3 at the upper surface of the substrate 10 formed between the peripheral edge of the second opening W2 and the peripheral edge of the first opening W1)+the diameter of the second opening W2+(the length of the other side of the region W3 at the upper surface of the substrate 10 formed between the peripheral edge of the second opening W2 and the peripheral edge of the first opening W1)=the diameter of the first opening W1.

While the substrate 10 can define only one through hole Z, providing a plurality of through holes Z in the substrate 10 is preferable to efficiently inject the resin member 80 (the adhesive agent 80 according to the third embodiment which will be described later) into the hollow part Y of the wall part 32.

Light Sources 20

The plurality of light sources 20 is disposed on the substrate 10. Specifically, in the light emitting device 1 as seen in a top view, the plurality of light sources 20 is disposed and mounted on the regions where no light reflecting member 30 exists. In such regions, conductive members 72 which will be described later are exposed. To the conductive members 72, the electrodes of the light sources 20 are connected. The regions can be referred to openings in terms of the absence of a reflecting member 70 covering the substrate 10, or the absence results in exposure of the conductive members 72. The light sources 20 can be mounted by flip-chip bonding, for example. Alternatively, the light sources 20 can be mounted by other techniques such as wire bonding using wires.

The interval of the plurality of light sources 20, that is, the interval by which the plurality of light sources 20 is adjacent to each other is in a range of, for example, from 5 mm to 25 mm. The interval of the plurality of light sources 20 is preferably constant (including substantially constant) in both of the longitudinal and lateral directions as seen in a top view.

The plurality of light sources 20 is preferably driven independently of each other. In particular, the light adjusting control (for example, local dimming or high dynamic range: HDR) is preferably exerted for each light source 20.

The plurality of light sources 20 each emits, for example, blue-color light. Besides blue, the color can be yellow, green or red.

Each light source 20 can include a light emitting element 22 such as a light emitting diode. The light emitting element 22 includes, for example, a light-transmissive substrate, and a semiconductor layer layered on the substrate. The light-transmissive substrate can be formed of, for example, sapphire. The semiconductor layer includes, for example, an n-type semiconductor layer, an active layer, and a p-type semiconductor layer in sequence from the substrate side. The semiconductor layer can be, for example, ZnSe, a nitride-based semiconductor ($In_xAl_yGa_{1-x-y}N$, $0 \leq X$, $0 \leq Y$, $X+Y \leq 1$), GaP, GaAlAs, or AlInGaP. To the n-type semiconductor layer, an n-side electrode is connected, for example. To the p-type semiconductor layer, for example, a p-side electrode is connected. Each light source 20 can include a reflecting layer at the upper surface of the light emitting element 22 (the surface opposite to the surface nearer to the substrate where the light emitting element is disposed). The reflecting layer can be a metal film or a dielectric multilayer film.

Each light source 20 can include an encapsulation member 26. The encapsulation member 26 is a member that protects the light emitting element 22 from the external environment, and optically controls light emitted from the light emitting element 22. The encapsulation member 26 is disposed on the substrate 10 so as to cover the light emitting element 22. The material of the encapsulation member 26 can be epoxy resin, silicone resin, mixture resin of epoxy and silicone, or a light transmissive material such as glass. Among these materials, silicone resin is preferable for its excellent light resistance and moldability. The encapsulation member 26 can contain a light diffusing material, a wavelength conversion material such as a fluorescent material that absorbs light from the light emitting element 22 and emits light having a wavelength different from that of the light emitted from the light emitting element 22, or a coloring agent corresponding to the color of light emitted from the light emitting element 22. The encapsulation member 26 can be formed by, for example, compression molding or injection molding, or dripping or drawing. By suitably adjusting the viscosity of the material of the encapsulation member 26, the shape of the encapsulation member 26 can be controlled by the surface tension of the material itself. By dripping or drawing, the encapsulation member 26 is provided easier without the necessity of using a molding die. The viscosity can be adjusted by using a material having a desired viscosity as the material of the encapsulation member 26, or by using the above-described light diffusing member, wavelength conversion member, or coloring agent.

Each light source 20 preferably has the batwing-type light distribution characteristic. In this manner, the amount of light emitted directly above the light source 20 is reduced, which contributes to widen the light distribution of the light source 20. Accordingly, particularly in the case in which a light-transmissive optical member 54 is provided so as to face the substrate 10, the thickness of the light emitting device 1 is reduced. In the batwing-type light distribution characteristic, the central part is darker than the peripheral part. Examples of the batwing-type light distribution characteristic can be: the light emission intensity distribution in which the light emission intensity becomes greater as the light distribution angle in terms of absolute value greater than 0° is greater using the optical axis L as 0°; or the light emission intensity distribution in which the light emission intensity is greatest around 45° to 90°. The encapsulation member 26 can be provided, for example, to cover the light emitting element 22 and the reflecting layer. The encapsulation member 26 disposed in such a manner may easily realize the batwing-type light distribution characteristic.

Light Reflecting Member 30

The light reflecting member 30 is a member that is disposed on the substrate 10 and includes the wall part 32 surrounding one of the light sources 20 individually or two or more of the light sources 20 in groups. The light reflecting member 30 may be referred to as the reflector. The wall parts 32 can surround the single light source 20 individually as in the present embodiment or can surround two or more of the plurality of light sources 20 in groups. That is, the wall part 32 includes a plurality of surrounding parts X defined by a first surface (the surface not facing the substrate 10) of the wall part 32. In each of the surrounding parts X, one light source 20 is disposed individually or two or more light sources 20 are disposed in groups. In the present specification, the surrounding parts X may be referred to as cells.

The wall part 32 further includes a second surface (the surface facing the substrate 10) on an opposite side of the first surface, and the second surface defines the hollow part Y that is formed with the first opening W1 on the substrate 10 side. By the first opening W1 and the second opening W2 of the substrate 10 overlapping each other in a top view, the through hole Z of the substrate 10 and the hollow part Y of the wall part 32 connect to each other. Thus, the resin member 80 can be injected into the hollow part Y of the wall part 32 from the lower surface side of the substrate 10 via the through hole Z of the substrate 10. The inner diameter and shape of the first opening W1 are not limited to specific diameter and shape, so long as the resin member 80 can be injected into the hollow part Y. Here, the first opening W1 (the outer edge of the first opening W1) is positioned outer than the second opening W2 (the outer edge of the second opening W2). With this configuration, the region W3 at the upper surface of the substrate 10 can be provided between the peripheral edge of the second opening W2 and the peripheral edge of the first opening W1, allowing the resin member 80 to be continuously in contact with the region W3 and the inner wall of the hollow part Y. The hollow part Y of the wall part 32 can be completely filled with the resin member 80, that is, the entire space in the hollow part Y of the wall part 32 can be filled with the resin member 80. As in the present embodiment, the resin member 80 is preferably injected into the hollow so as to cover spread in a plane (including a substantial plane) from the peripheral edge of the second opening W2 as seen in a top view. In other words, it is not necessary for the entire space in the hollow part Y to be filled with the resin member 80. The resin member 80 should be injected into the hollow part Y by the amount enough to fix the light reflecting member 30 to the substrate 10. In the third embodiment described later, the wall part 32 preferably defines the hollow part Y formed with the first opening W1 on the substrate 10 side. In the third embodiment described later, the resin member 80 is paraphrased as the adhesive agent 80 to construe the present paragraph.

The light reflecting member 30 includes a bottom surface part 322, and the bottom surface part 322 is preferably disposed on the substrate 10. Thus, the light reflecting member 30 is stably disposed on the substrate 10. The bottom surface part 322 is preferably planar, so that the light reflecting member 30 is more stably disposed. Being planar includes the state substantially planar. No double-sided tape is interposed between the bottom surface part 322 and the substrate 10.

The wall part 32 is formed by, for example, the light reflecting member 30 being bent to open outward. In other words, the wall part 32 is formed by, for example, the light reflecting member 30 being bent so as to project upward (in a direction opposite to the substrate 10). The light reflecting member 30 has a shape in which, for example, the bottom surface part 322 and the wall part 32 are repeatedly arranged. The hollow part Y of the wall part 32 is, for example, a recess formed on the lower side of the light reflecting member 30 (i.e., the side of the light reflecting member 30 that faces the substrate 10) by bending the light reflecting member 30. The first opening W1 of the hollow part Y is an opening plane of such a recess, and is on the identical plane as the lower surface of the bottom surface part 322, for example. That is, the opening plane of the first opening W1 and the lower surface of the bottom surface part 322 are identical to each other in height with reference to the upper surface of the substrate 10.

The lateral surface of the wall part 32 preferably includes a lateral surface part 324 that is inclined so that a top part 326 of the wall part 32 becomes far from the light source 20 than the bottom surface part 322, so as to facilitate reflection of light from the light source 20 directed upward. In order to facilitate upward reflection of the light from the light source 20, the lateral surface part 324 preferably includes, or entirely formed of, an inclined plane. The bottom surface part 322 extends from one end of the lateral surface part 324, and the top part 326 of the wall part 32 extends from the other end.

The interval of the wall parts 32, that is, the interval by which the wall parts 32 are adjacent to each other is in a range of, for example, from 5 mm to 25 mm. The interval of the wall parts 32 is preferably constant (including substantially constant) in both of the longitudinal and lateral directions as seen in a top view.

The light reflecting member 30 can be formed of, for example, resin containing a reflecting member formed of metal oxide particles such as titanium oxide, aluminum oxide, or silicon oxide. Alternatively, the light reflecting member 30 can be formed of resin containing no reflecting member and a reflecting member provided on the surface of the resin.

The thickness of the light reflecting member 30 (the height from the upper surface of the substrate 10 to the upper edge of the wall part 32) is in a range of, for example, 100 µm to 300 µm. The thickness of the light reflecting member 30 is preferably uniform. Being uniform includes the state substantially uniform.

Resin Member 80

The resin member 80 is continuously in contact with the inner wall of the hollow part Y and the region W3 at the upper surface of the substrate 10 provided between the peripheral edge of the second opening W2 and the peripheral edge of the first opening W1. Thus, the resin member 80 bonds the inner wall of the hollow part Y and the region W3 at the upper surface of the substrate 10 to each other, whereby the light reflecting member 30 is fixed to the substrate 10. The resin member 80 can function as an anchor that inhibit displacement of the light reflecting member 30 due to heat expansion and contraction.

The resin member 80 can be a member that reflects light emitted from the light sources 20. This can improve the reflectivity of the light reflecting member 30. Conversely, the resin member 80 can be a member that absorbs light emitted from the light sources 20. This may reduce leakage of light to an adjacent unlit cell in the local dimming mode.

The resin member 80 can be formed of, for example, thermoplastic resin.

According to the first embodiment described above, a light emitting device with good light extraction efficiency can be obtained.

If the light reflecting member is fixed to the substrate with a double-sided tape, light emitted from the light sources may enter the double-sided tape and be absorbed. On the other hand, in the case in which the light reflecting member 30 is fixed to the substrate 10 by the resin member 80 without using a double-sided tape, such light absorption by the double-sided tape fixing the light reflecting member 30 may not occur. Thus, a light emitting device with good light extraction efficiency can be provided.

If the light reflecting member is fixed to the substrate with a double-sided tape, a small interval between the light sources reduces the area in which the light reflecting member and the substrate contact with each other. Thus, the area for bonding the double-sided tape may be insufficient, failing to secure the mount strength of the light reflecting member to the substrate. In the case in which the light reflecting member 30 is fixed to the substrate 10 with the resin member 80 without using a double-sided tape, a small interval between the light sources may still secure the mount strength of the light reflecting member 30 to the substrate 10.

In the case in which the light reflecting member 30 is fixed to the substrate 10 with the resin member 80 but not using the double-sided tape, the thickness (height) of the light emitting device 1 is reduced by the thickness of the double-sided tape, resulting in the light emitting device 1 with a reduced thickness. This may provide the reduced thickness and improved optical characteristic of the light emitting device 1. This is particularly effective in the case in which, for example, the light emitting device 1 is used as one unit.

In the case in which a member disposed above the light emitting device 1 is further supported by a support member such as a pin, and the wall part 32 and the support member are integrated, the strength of the light reflecting member 30 can be improved by the resin member 80 injected into the wall part 32.

In the following, a description will be given of other structures.

Conductive Wirings 72, 84

At least at the upper surface of the substrate 10, a conductive wiring 72 for supplying power to the light source 20 is disposed. The conductive wiring 72 is the member electrically connected to the electrode of the light source 20 for supplying current (power) from the outside. The thickness of the conductive wiring 72 can be selected as appropriate. The material of the conductive wiring 72 can be selected as appropriate according to the material of the substrate 10 and the method of manufacturing the substrate 10. For example, in the case in which the material of the substrate 10 is ceramic, the material of the conductive wiring 72 preferably has a high melting point that withstands the firing temperature of the ceramic sheet. For example, high-melting point metal such as tungsten or molybdenum is preferable. Alternatively, the conductive wiring 72 can be formed of such metal having its surface coated with other metal material such as nickel, gold, or silver by plating, sputtering, or vapor deposition. In the case in which the material of the substrate 10 is glass epoxy resin, the material of the conductive wiring 72 is preferably a material that is easily processed. The conductive wiring 72 can be formed on one or both of the surfaces of the substrate 10 by vapor deposition, sputtering, or plating. Metal foil can be bonded by pressing, to serve as the conductive wiring 72. The metal foil is masked by printing or photolithography, and patterned by etching, to provide the conductive wiring 72 with a predetermined shape. The thickness of the conductive wiring 72 is preferably uniform. Being uniform includes the state substantially uniform. The light emitting device 1 can include a conductive wiring 84 at the lower surface of the substrate 10 in addition to the upper surface of the substrate 10.

Reflecting Members 70, 82

A reflecting member 70 is an insulating member that reflects light or substantially prevents leakage or absorption of light, to improve the light extraction efficiency of the light emitting device 1. The reflecting member 70 is disposed to cover the upper surface of the substrate 10 and the upper surface of the conductive wiring 72. The reflecting member 70 can be, for example, a member containing white-base color filler. While the material of the reflecting member 70 is not limited to specific material so long as it is insulating, it is preferably a material that less absorbs light from the light emitting elements 22. For example, the material of the reflecting member 70 can be epoxy, silicone, modified silicone, urethane resin, oxetane resin, acrylic resin, polycarbonate, polyimide, polyethylene terephthalate (PET), or polyethylene naphthalate (PEN). The thickness of the reflecting member 70 can be selected as appropriate. The thickness of the reflecting member 70 is preferably uniform. Being uniform includes the state substantially uniform. A reflecting member 82 can be disposed on the lower surface side of the substrate 10 so as to cover the lower surface of the conductive wiring 84.

Bonding Member 74

The light emitting device 1 can include a bonding member 74. The bonding member 74 is a member for fixing the light source 20 to the substrate 10 and/or the conductive wiring 72. An example of the bonding member 74 can be insulating resin or a conductive member. In the case in which the light source 20 is flip-chip mounted, a conductive member can be used as the bonding member 74. Examples of the bonding member 74 include Au-containing alloy, Ag-containing alloy, Pd-containing alloy, In-containing alloy, Pb—Pd-containing alloy, Au—Ga-containing alloy, Au—Sn-containing alloy, Sn-containing alloy, Sn—Cu-containing alloy, Sn—Cu—Ag-containing alloy, Au—Ge-containing alloy, Au—Si-containing alloy, Al-containing alloy, Cu—In-containing alloy, and a mixture of metal and flux. The bonding member 74 can be, for example, one of or a combination of liquid-like, paste-like, and solid (sheet-like, block-like, powdery, or wire-like) members, which can be selected as appropriate according to the composition or shape of the substrate 10. In the case in which electrically connecting the light sources 20 to the conductive wiring 72 and mounting and fixing the light sources 20 onto the substrate 10 are separately performed, the light sources 20 and the conductive wiring 72 can be electrically connected to each other using wires other than the bonding member 74.

In the following, a description will be given of an example of the members disposed above the light emitting device.

Light Diffusing Member 52

Above the light emitting device 1, a light diffusing member 52 can be disposed on the light incident side of a wavelength conversion member 40. The light diffusing member 52 is a member that diffuses light emitted from the plurality of light sources 20, to reduce luminance non-uniformity. The material of the light diffusing member 52 can be, for example, a material that less absorbs visible light such as polycarbonate resin, polystyrene resin, acrylic resin, or polyethylene resin. The light diffusing member 52 can be, for example, a member that is formed of a base material containing a material different in refractive index from the base material, or a member that is formed of a base material of which surface is processed to scatter light. The thickness of the light diffusing member 52 is preferably uniform. Being uniform includes the state substantially uniform.

Optical Member 54

An optical member 54 can be disposed on the light incident side of the wavelength conversion member 40. The optical member 54 is a member that applies an optical effect to light from the light sources 20. The optical member 54 can be a light-transmissive member such as a half mirror, for example. The half mirror can be a member that reflects part of incident light and transmits the other part of light. The half mirror is preferably set to exhibit lower reflectivity to oblique incident than vertical incident. That is, the half mirror preferably exhibits higher light reflectivity to a portion of light emitted in parallel to the optical axis direction of light emitted from the light sources 20, and exhibits lower light reflectivity to a portion of the light as greater the irradiation angle. In other words, the amount of light transmitting through the half mirror increases as the irradiation angle is wider. The term "irradiation angle" is defined that the light parallel to the optical axis direction is 0 degree in the irradiation angle. In this manner, uniform luminous distribution is easily provided as seen from the light emission side. The half mirror can be, for example, a dielectric multilayer film. A dielectric multilayer film can provide a reflecting film that less absorbs light. In addition, by the design of the film, the reflectivity can be appropriately adjusted, and the reflectivity can be controlled for each angle. For example, a dielectric multilayer film that is designed to exhibit lower reflectivity to light becoming obliquely incident on the half mirror than perpendicularly incident light can easily realize the characteristic of higher reflectivity to light becoming perpendicularly incident on the light extraction surface and lower reflectivity to light becoming incident on the light extraction surface at a greater angle. The thickness of the optical member 54 is preferably uniform. Being uniform includes the state substantially uniform.

Wavelength Conversion Member 40

The wavelength conversion member 40 can be disposed so as to oppose to the substrate 10 with reference to the plurality of light sources 20. The wavelength conversion member 40 is a member that contains a fluorescent material. Specifically, a member formed of a base material such as polyethylene terephthalate (PET) or polycarbonate (PC) and a fluorescent material contained in the base material, or a member obtained by sintering a fluorescent material is preferable as the wavelength conversion member 40. The fluorescent material can be oxides, nitrides, sulfides, fluorides, or quantum dots. Specific examples of the fluorescent material can be, for example, a cerium-activated yttrium-aluminum-garnet (YAG)-based fluorescent material, or a cerium-activated lutetium-aluminum-garnet (LAG). The fluorescent material is excited by the first-color light emitted from the light sources 20 and emits the second-color light. In the case in which the color of the light emitted from the light sources 20 (the first color) is blue, the fluorescent material is preferably a substance that is excited by the blue-color light and emits yellow-color light as the second-color light. In the case in which the color of the light emitted from the light sources 20 (the first color) is yellow, the fluorescent material is preferably a substance that is excited by the yellow-color light and emits green-color light and/or red-color light as the second-color light. The thickness of the wavelength conversion member 40 is preferably uniform. Being uniform includes the state substantially uniform.

Prism Sheets 56, 58

Prism sheets 56, 58 can be disposed on the light emitting side of the wavelength conversion member 40. The prism sheets 56, 58 are members that change the direction of incident light from oblique to vertical for improving the front luminance. The material of the prism sheets 56, 58 can be polyethylene terephthalate or acrylic resin. The thickness of the prism sheets 56, 58 is preferably uniform. Being uniform includes the state substantially uniform.

Polarizing Sheet 60

A polarizing sheet 60 can further be disposed. The polarizing sheet 60 can change the direction of polarized light that has failed to transmit and has been reflected by the liquid crystal panel so that the light is again directed to the liquid crystal panel to become polarized light that transmits through the liquid crystal panel. Thus, the polarizing sheet 60 may improve luminance.

Light Emitting Device 2 According to the Second Embodiment

Figure 2A:
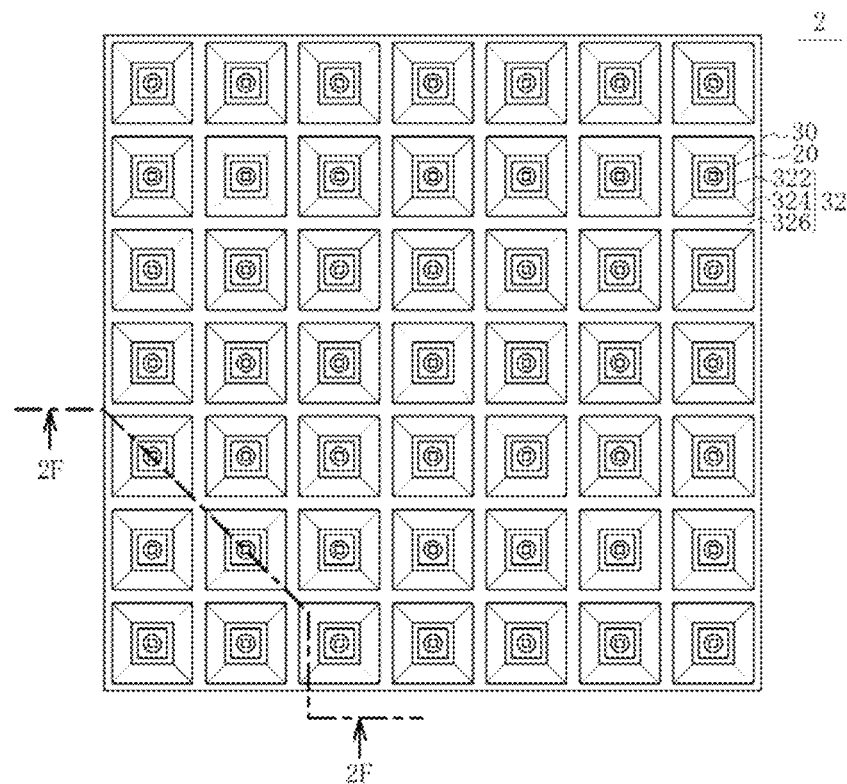
FIG. 2A is a schematic top view of a light emitting device according to a second embodiment.
Figure 2B:
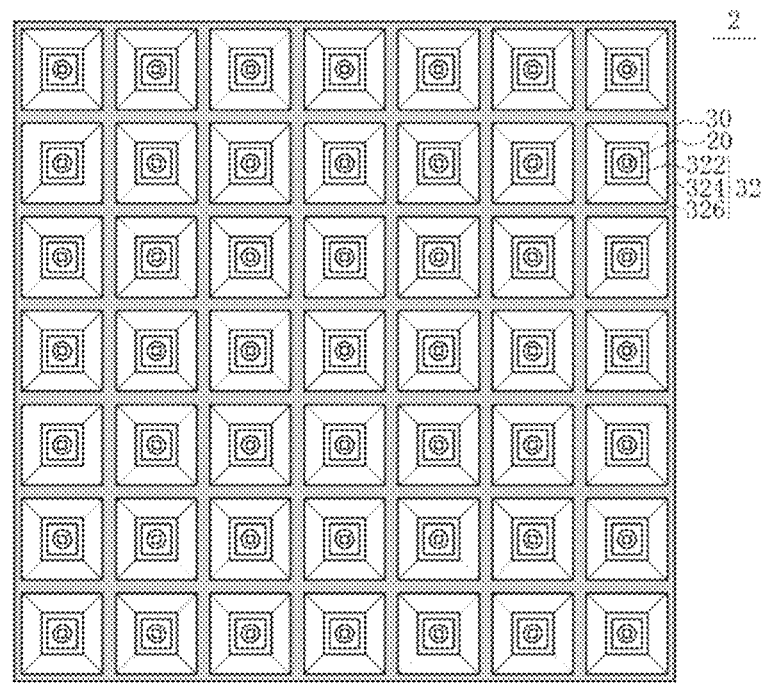
FIG. 2B corresponds to FIG. 2A in which a top part of a wall part is hatched.
Figure 2C:
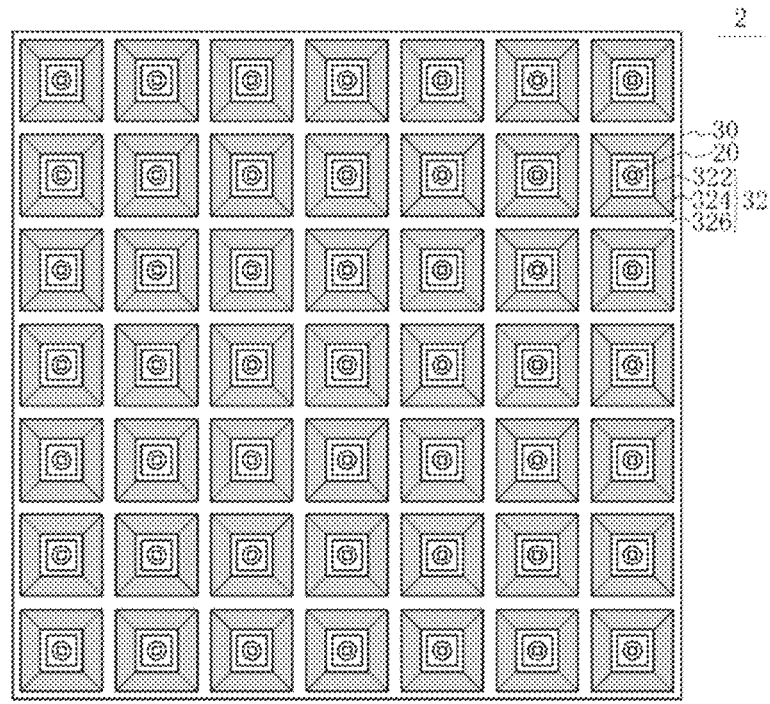
FIG. 2C corresponds to FIG. 2A in which lateral surface parts of the wall part is hatched.
Figure 2D:
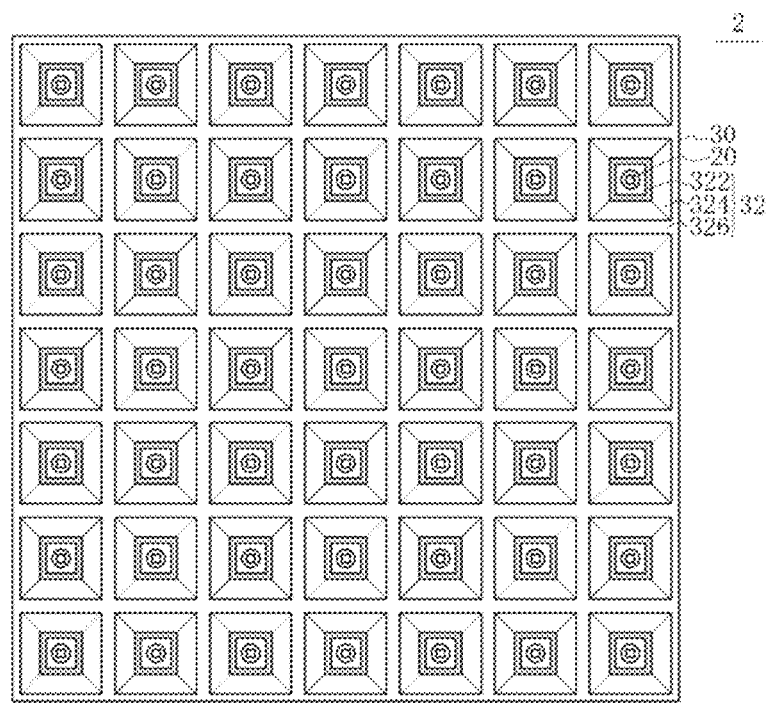
FIG. 2D corresponds to FIG. 2A in which a bottom surface part of the wall part is hatched.
Figure 2E:
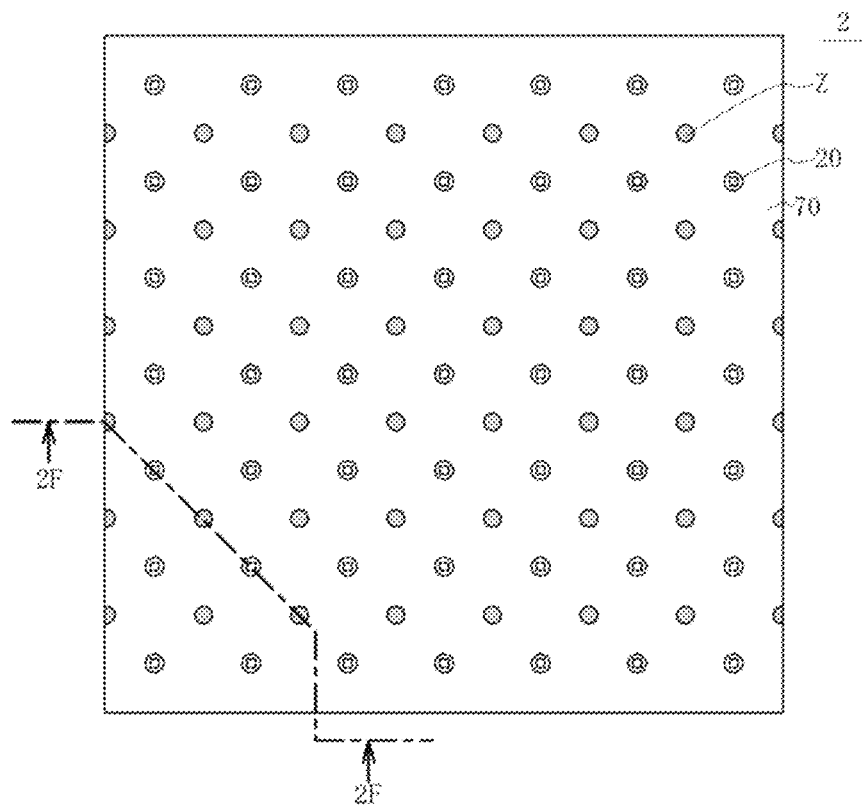
FIG. 2E shows the positional relationship between through holes (second openings) of a substrate and light sources.
Figure 2F:
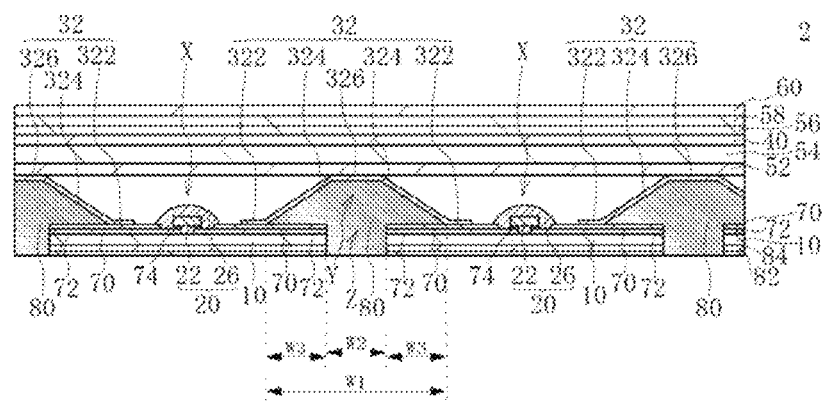
FIG. 2F is a cross-sectional view taken along line 2F-2F in FIG. 2A.

FIG. 2A is a schematic top view of a light emitting device according to a second embodiment. FIG. 2B corresponds to FIG. 2A in which a top part of the wall part is hatched. FIG. 2C corresponds to FIG. 2A in which a lateral surface part of the wall part is hatched. FIG. 2D corresponds to FIG. 2A in which a bottom surface part of the wall part is hatched. FIG. 2E shows the positional relationship between through holes (second openings) of a substrate and light sources without showing a light reflecting member 30 and an adhesive agent 80. FIG. 2F is a cross-sectional view taken along line 2F-2F in FIG. 2A. FIG. 2F shows also members disposed above the light emitting device 1.

As shown in FIGS. 2A to 2F, the light emitting device 2 according to the second embodiment is different from the light emitting device 1 according to the first embodiment in that the top part 326 of the wall part 32 is in contact with a member disposed above the light emitting device 2.

Figure 5:
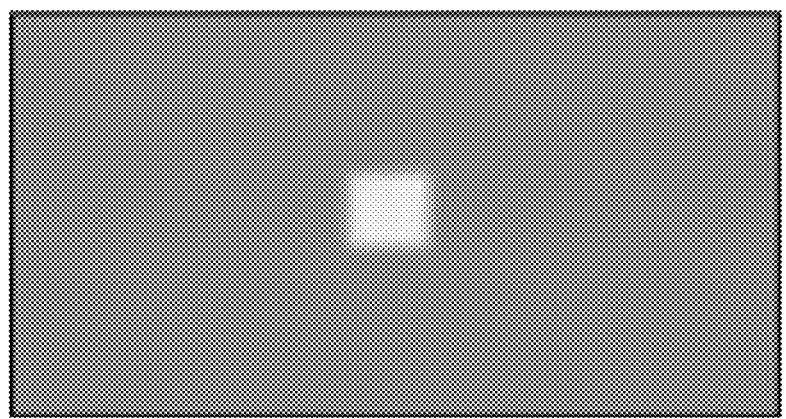
FIG. 5 is a photograph of an example of one cell seen in a top view with a light source of one cell being turned on and a top part of a wall part being in contact with a member disposed above a light emitting device (the second embodiment).
Figure 6:
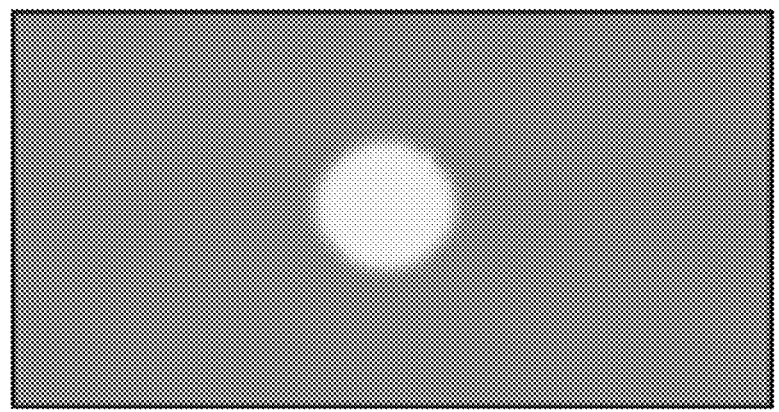
FIG. 6 is a photograph of an example of one cell seen in a top view with a light source being turned on and the top part of the wall part being not in contact with the member disposed above the light emitting device (Comparative Example).

The light emitting device 2 according to the second embodiment may achieve the effect similar to that of the light emitting device 1 according to the first embodiment. Additionally, by virtue of eliminating the space between the wall part 32 (the light emitting device 2) and the light diffusing member 52, leakage of light to the adjacent cell defined by the surrounding part X can be reduced. This can inhibit or prevent a reduction in contrast ratio which would otherwise be invited by such leakage. For example, FIG. 5 is a photograph of an example of one cell seen in a top view with a light source of one cell being turned on and the top part of the wall part being in contact with a member disposed above the light emitting device according to the second embodiment. FIG. 6 is a photograph of an example of one cell seen in a top view with a light source being turned on and the top part of the wall part being not in contact with the member disposed above the light emitting device according to Comparative Example. In FIGS. 5 and 6, the portion appeared as white is light. In FIG. 5, the light is appeared in quadrangular shape. In FIG. 6, the light is appeared in circular shape. As shown in FIGS. 5 and 6, in the case in which the top part 32b of the wall part is in contact with the member disposed above the light emitting device 2, the shape of light is the same as or a similar to the shape of the cell as seen in a top view as compared to the case in which the top part 32b is not in contact. Accordingly, FIG. 5 shows the leakage of light emitted from the cell to the adjacent cell is less compared to FIG. 6. The second embodiment can provide a light emitting device in which light is clearly distinguishable, by the reduced light leakage to adjacent cells and the inhibited reduction in contrast ratio.

In general, for the purpose of supporting the member positioned above the light reflecting member 30 by the light reflecting member 30, the strength of the light reflecting member 30 is insufficient. Accordingly, the member positioned above the light reflecting member 30 is supported by a separately provided support member such as a pin. Provision of such a support member forms space between the light reflecting member 30 and the member positioned above the light reflecting member 30. In this configuration, light emitted from one cell may leak to the adjacent cells. In the second embodiment, however, the resin member 80 (the adhesive agent 80 according to the fourth embodiment which will be described later) is injected into the hollow part Y of the wall part 32 of the light reflecting member 30. By the resin member 80 (the adhesive agent 80 according to the fourth embodiment which will be described later) functioning as a reinforcement member, the strength of the light reflecting member 30 may improve. Accordingly, the light reflecting member 30 is provided with the strength enough to support the member positioned above the light reflecting member 30 and, hence, the light reflecting member 30 can support the member positioned above. Accordingly, the necessity of separately providing a support member such as a pin is eliminated, whereby no space is formed between the light reflecting member 30 and the member positioned above. In this manner, the second embodiment can make it possible to mount a member above the light reflecting member 30 and, hence, can provide a light emitting device in which light is clearly distinguishable, and high contrast ratio is realized.

The top part 32b of the wall part 32 is preferably planar. Thus, the top part 32b can stably support the member positioned above the light emitting device 2. Being planar includes the state substantially planar. The top part 32b of the wall part 32 can be formed to have the shape of a support member such as a pin described above.

The foregoing is the description of the light emitting device 2 according to the second embodiment. The other structures are the same as or a similar to the light emitting device 1 according to the first embodiment and, therefore, a description thereof will be omitted.

Method of Manufacturing Light Emitting Device 1 According to the First Embodiment FIGS. 3A to 3D are each a schematic cross-sectional view for illustrating the method of manufacturing the light emitting device according to the first embodiment. In the following, with reference to FIGS. 3A to 3D, a description will be given of the method of manufacturing the light emitting device 1 according to the first embodiment.

Figure 3A:
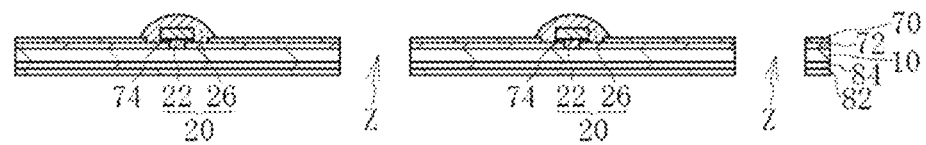
FIG. 3A is a schematic cross-sectional view for illustrating a method of manufacturing the light emitting device according to the first embodiment.

Firstly, as shown in FIG. 3A, the substrate 10 on which a plurality of light sources 20 is disposed is provided. The substrate 10 is provided with the through hole Z that penetrates through the substrate 10 in the top-bottom direction and defines the second opening W2 positioned inner than the first opening W1 at the upper surface of the substrate 10. The through hole Z can be formed at the substrate 10 after the substrate 10 is provided. Alternatively, the substrate 10 previously provided with the through hole Z can be used.

Figure 3B:
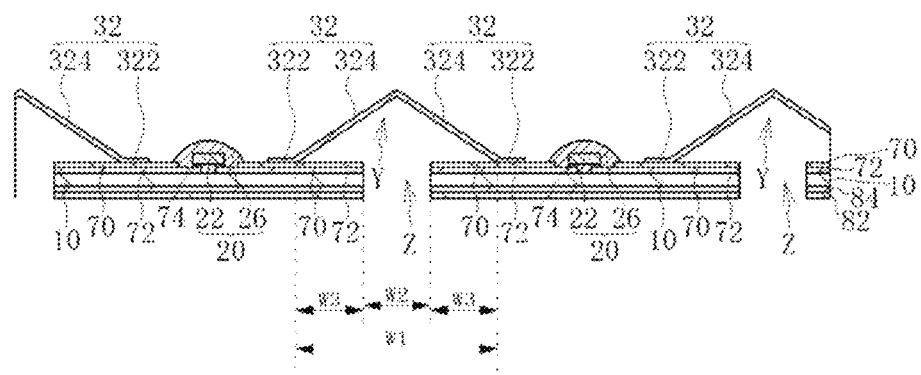
FIG. 3B is a schematic cross-sectional view for illustrating the method of manufacturing the light emitting device according to the first embodiment.

Subsequently, as shown in FIG. 3B, the light reflecting member 30 including the wall part 32 that surrounds one of the light sources 20 or two or more of the plurality of light sources 20 is disposed on the substrate 10. In this example, the wall part 32 is provided with, for example, the hollow part Y that is previously formed with the first opening W1 on the substrate 10 side.

Figure 3C:
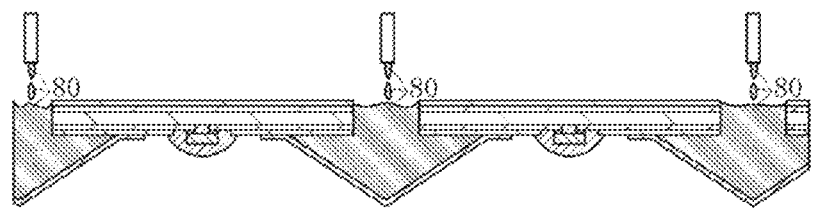
FIG. 3C is a schematic cross-sectional view for illustrating the method of manufacturing the light emitting device according to the first embodiment.

Subsequently, as shown in FIG. 3C, setting the lower surface of the substrate 10 oriented upward, the resin member 80 is injected into the hollow part Y of the wall part 32 through the through hole Z from the lower surface side of the substrate 10. Thus, the resin member 80 is provided to be continuously in contact with the inner wall of the hollow part Y and the region W3 at the upper surface of the substrate 10 provided between the peripheral edge of the second opening W2 and the peripheral edge of the first opening W1.

Figure 3D:
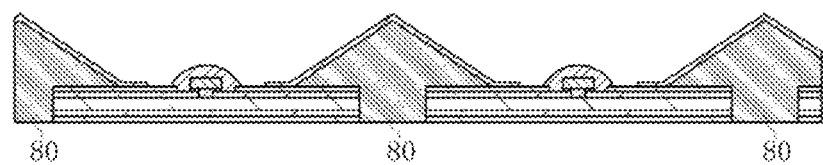
FIG. 3D is a schematic cross-sectional view for illustrating the method of manufacturing the light emitting device according to the first embodiment.

Subsequently, as shown in FIG. 3D, the resin member 80 is cured (or solidified). Thus, the inner wall of the hollow part Y and the region W3 at the upper surface of the substrate 10 provided between the peripheral edge of the second opening W2 and the peripheral edge of the first opening W1 are bonded to each other by the resin member 80, whereby the light reflecting member 30 is fixed to the substrate 10.

Method of Manufacturing Light Emitting Device 2 According to the Second Embodiment FIGS. 4A to 4D are each a schematic cross-sectional view for illustrating the method of manufacturing the light emitting device according to the second embodiment. In the following, with reference to FIGS. 4A to 4D, a description will be given of the method of manufacturing the light emitting device 2 according to the second embodiment.

Figure 4A:
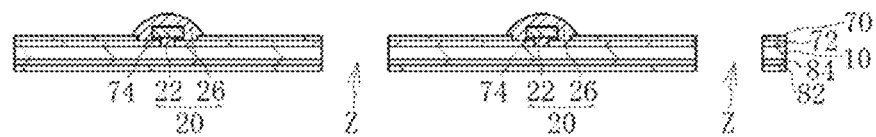
FIG. 4A is a schematic cross-sectional view for illustrating a method of manufacturing the light emitting device according to a second embodiment.

As shown in FIG. 4A, the substrate 10 on which a plurality of light sources 20 is disposed is provided. The substrate 10 is provided with the through hole Z that penetrates through the substrate 10 in the top-bottom direction and defines the second opening W2 positioned inner than the first opening W1 at the upper surface of the substrate 10. The through hole Z can be formed at the substrate 10 after the substrate 10 is provided. Alternatively, the substrate 10 previously provided with the through hole Z can be used.

Figure 4B:
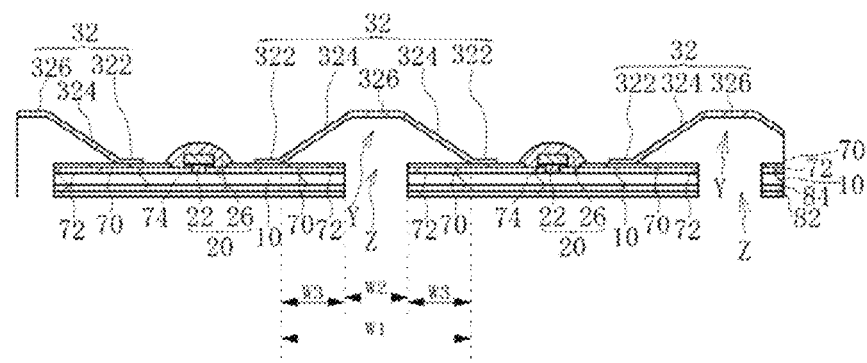
FIG. 4B is a schematic cross-sectional view for illustrating the method of manufacturing the light emitting device according to the second embodiment.

Subsequently, as shown in FIG. 4B, the light reflecting member 30 including the wall part(s) 32 that surround(s) one of the light sources 20 or the plurality of light sources 20 is disposed on the substrate 10. In this example, the wall part 32 is provided with, for example, the hollow part Y that is previously formed with the first opening W1 on the substrate 10 side.

Figure 4C:
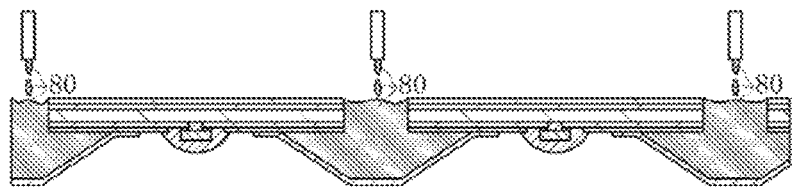
FIG. 4C is a schematic cross-sectional view for illustrating the method of manufacturing the light emitting device according to the second embodiment.

Subsequently, as shown in FIG. 4C, setting the lower surface of the substrate 10 oriented upward, the resin member 80 is injected into the hollow part Y of the wall part 32 through the through hole Z from the lower surface side of the substrate 10. Thus, the resin member 80 is provided to be continuously in contact with the inner wall of the hollow part Y and the region W3 at the upper surface of the substrate 10 provided between the peripheral edge of the second opening W2 and the peripheral edge of the first opening W1.

Figure 4D:
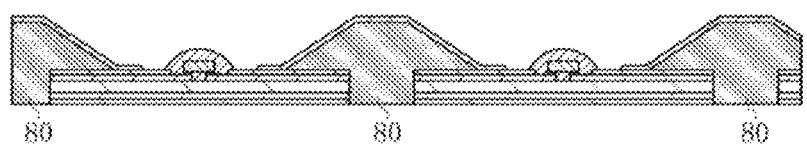
FIG. 4D is a schematic cross-sectional view for illustrating the method of manufacturing the light emitting device according to the second embodiment.

Subsequently, as shown in FIG. 4D, the resin member 80 is cured (or solidified). Thus, the inner wall of the hollow part Y and the region W3 at the upper surface of the substrate 10 provided between the peripheral edge of the second opening W2 and the peripheral edge of the first opening W1 are bonded to each other by the resin member 80, whereby the light reflecting member 30 is fixed to the substrate 10.

Light Emitting Device 3 According to the Third Embodiment

Figure 7A:
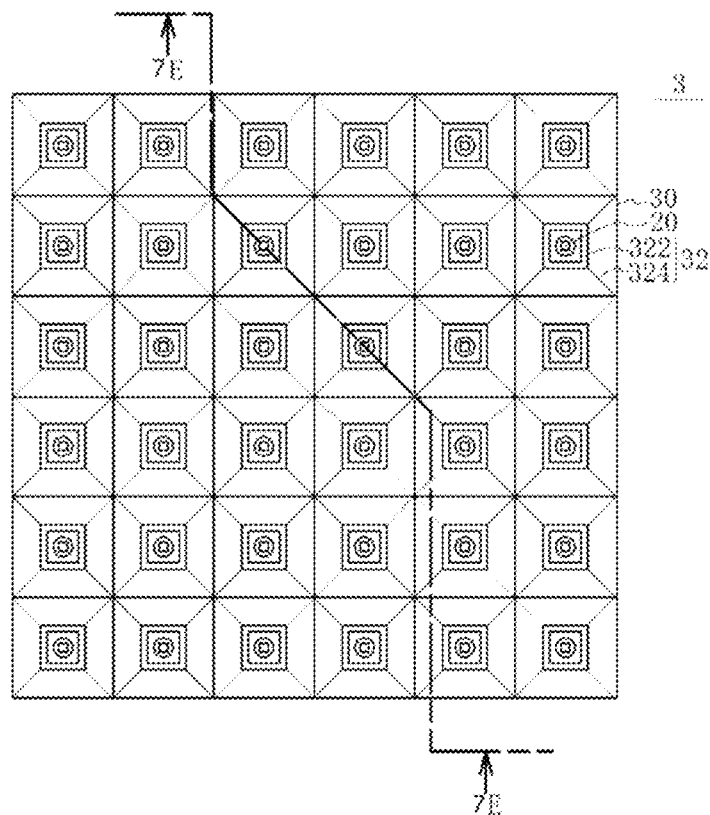
FIG. 7A is a schematic top view of a light emitting device according to a third embodiment.
Figure 7B:
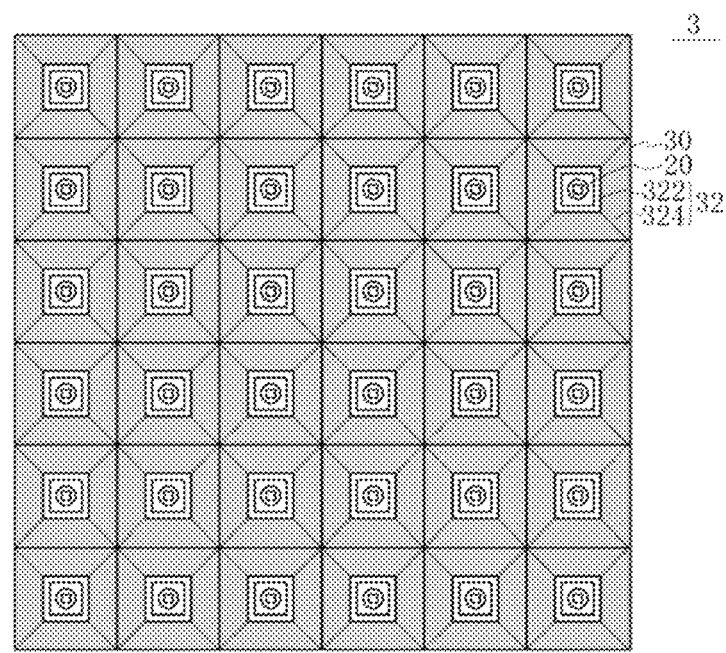
FIG. 7B corresponds to FIG. 7A in which a lateral surface part of each wall part is hatched.
Figure 7C:
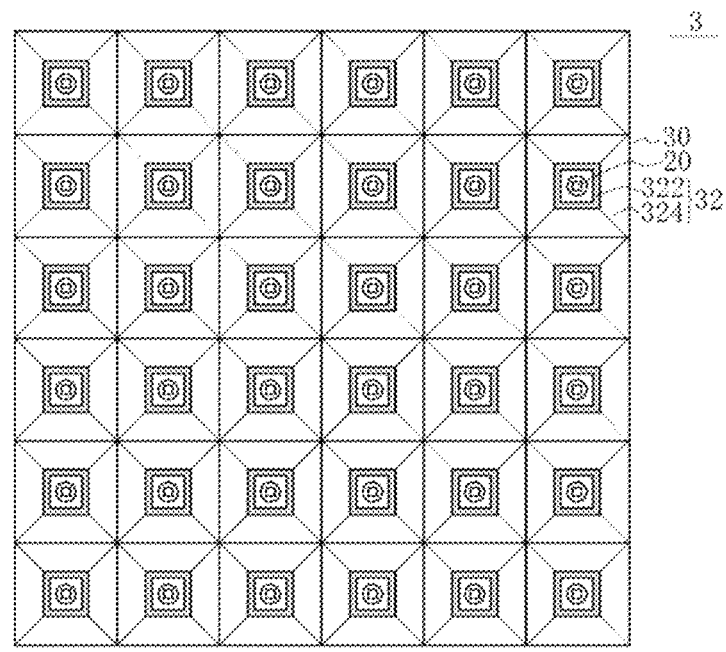
FIG. 7C corresponds to FIG. 7A in which a bottom surface part of each wall part is hatched.
Figure 7D:
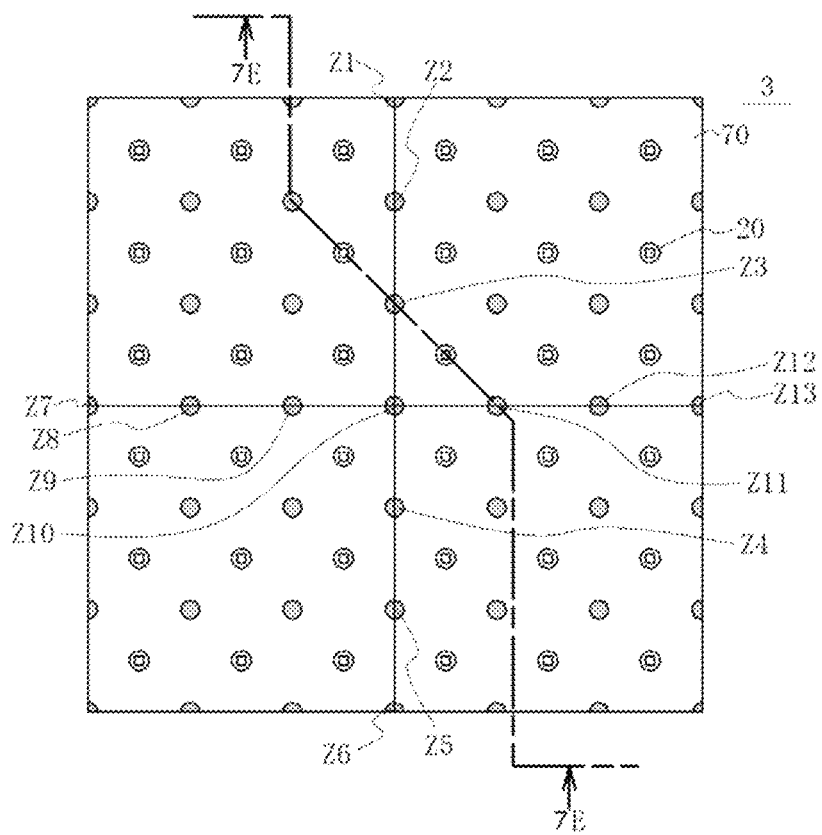
FIG. 7D shows the positional relationship between through holes (second openings) of a substrate and light sources.
Figure 7E:
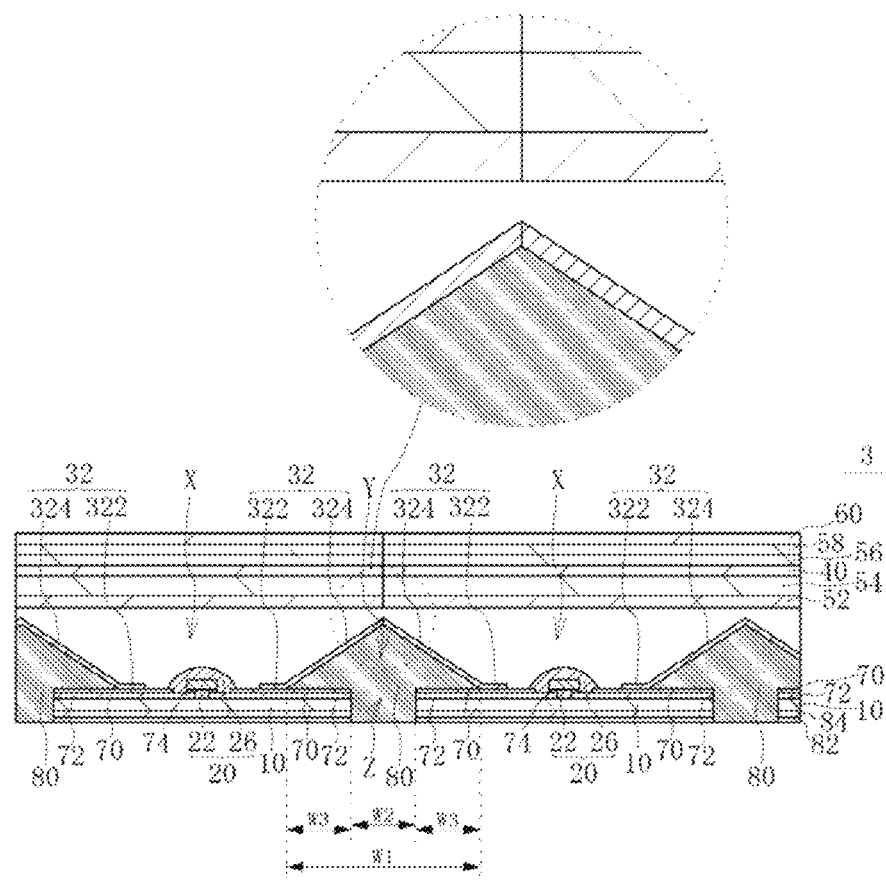
FIG. 7E is a cross-sectional view taken along line 7E-7E in FIG. 7A.
Figure 7F:
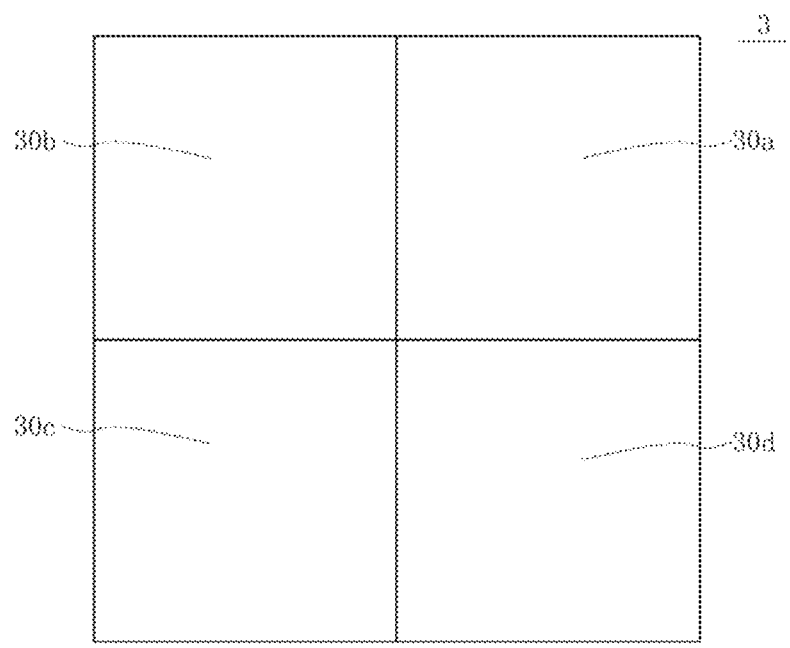
FIG. 7F shows four light reflecting members being joined.

FIG. 7A is a schematic top view of a light emitting device according to a third embodiment. FIG. 7B corresponds to FIG. 7A in which the lateral surface part 324 of each wall part 32 is hatched. FIG. 7C corresponds to FIG. 7A in which the bottom surface part 322 of each wall part 32 is hatched. FIG. 7D shows the positional relationship between the through holes (the second openings) of the substrate and the light sources without showing the light reflecting member 30 and the adhesive agent 80. FIG. 7E is a cross-sectional view taken along line 7E-7E in FIG. 7A. FIG. 7E also shows members disposed above the light emitting device 3. FIG. 7F shows four light reflecting members being joined.

As shown in FIGS. 7A to 7F, a light emitting device 3 according to the third embodiment is a light emitting device that includes a plurality of light sources 20 disposed on the substrate 10, and a plurality of light reflecting members 30 disposed on the substrate 10 and including wall parts 32 surrounding one of the light sources 20 or two or more of the plurality of light sources 20. Two adjacent ones of the light reflecting members 30 are joined to each other such that the outer surfaces of their respective wall parts 32 are bonded to each other via the adhesive agent 80. In the light emitting device 3 according to the third embodiment, four light reflecting members 30a, 30b, 30c, 30d are joined to each other. The light reflecting members are respectively disposed on the upper right side, the upper left side, the lower left side, and the lower right side in the drawing. One light reflecting member includes nine surrounding parts X in a matrix of three rows and three columns. In the following, the structures similar to those of the first embodiment are denoted by similar reference characters, and a detailed description will be given of the differences.

The interval between adjacent light sources 20 of respective two adjacent ones of the light reflecting members 30, for example, the interval between the light source 20 positioned on the leftmost side in the light reflecting member 30a and the light source 20 positioned on the rightmost side in the light reflecting member 30b in the drawing as seen in a top view, is preferably identical (being identical includes the state substantially identical or constant) to the interval of the other light sources 20 in the vertical and lateral directions, so that the boundary region between the joined two light reflecting members becomes substantially identical to the other portion in shape and reflecting state.

The two adjacent ones of the light reflecting members 30 are joined to each other such that the outer surfaces of their respective wall parts 32 are bonded to each other via the adhesive agent 80. For example, the outer surface of the wall part 32 positioned on the leftmost side in the light reflecting member 30d is bonded to the outer surface of the wall part 32 positioned on the rightmost side in the light reflecting member 30c via the adhesive agent 80. Thus, by virtue of the two adjacent ones of the light reflecting members 30 joined to each other such that the outer surfaces of their respective wall parts are bonded to each other via the adhesive agent 80, gap between the two joined light reflecting members 30 is less likely to be generated. Furthermore, the shape and reflecting state of the boundary region of the two joined light reflecting members 30 can become substantially identical to that of the other portion. For example, FIG. 7E shows the wall parts 32 or part of the wall parts 32 at three locations, namely, the right side, the central side, and the left side, and the shapes of such wall parts are substantially identical to each other. According to the present embodiment, a plurality of light reflecting members can be integrated with less influence on the optical characteristic of the individual light reflecting members 30.

At the top part of each of the wall parts 32 (see the partially enlarged illustration in FIG. 7E), preferably respective end surfaces of the wall parts 32 are in contact with each other without interposition of the adhesive agent 80. In other words, preferably respective outer surfaces of the wall parts 32 are in contact with each other without a gap between them. This can inhibit luminance non-uniformity that would otherwise be caused by light entering the gap.

The interval between adjacent wall parts 32 of respective two adjacent ones of the light reflecting members 30, for example, the interval between the wall part 32 positioned on the leftmost side of the light reflecting member 30a and the wall part 32 positioned on the rightmost side of the light reflecting member 30b in the drawing as seen in a top view, is preferably identical (being identical includes the state substantially identical) to the interval of the other wall parts 32 in the vertical and lateral directions, so that the boundary region between the joined two light reflecting members becomes substantially identical to the other portion in shape and reflecting state.

Adhesive Agent 80

The adhesive agent 80 can be formed of thermoplastic resin, for example.

The adhesive agent 80 can be a member that reflects light emitted from the light sources 20. This may improve the reflectivity of the light reflecting member 30. The adhesive agent 80 can be a member that absorbs light emitted from the light source 20. This can reduce leakage of light to an adjacent unlit cell in the local dimming mode.

According to the third embodiment described above, the light emitting device 3 with good light extraction efficiency can be obtained.

The size of each of the light reflecting members 30 is determined depending on the apparatus that produces the light reflecting member 30. Accordingly, in the case in which the light reflecting member 30 with a greater size is needed to be employed in, for example, a large-size monitor, a plurality of light reflecting members 30 is needed to be joined and integrated. Gap(s) between the combined plurality of light reflecting members 30 may let light to enter. This may cause luminance non-uniformity. In the present embodiment, two adjacent ones of the light reflecting members 30 are joined to each other such that the outer surfaces of their respective wall parts 32 are bonded to each other via the adhesive agent 80. Accordingly, generation of a gap between the two joined light reflecting members 30 is inhibited.

In the case in which a plurality of light reflecting members is bonded to each other with a double-sided tape, the shape and reflecting state of the bonded portion becomes different from the other portion by the thickness of the double-sided tape. This may cause luminance non-uniformity. In the present embodiment, two adjacent ones of the light reflecting members 30 are joined to each other not with a double-sided tape but having the outer surfaces of their respective wall parts 32 bonded to each other via the adhesive agent 80. Thus, the boundary region between the two joined light reflecting members 30 has substantially the same shape and reflecting state as those of the other portion. For example, with reference to FIG. 7E, the wall parts 32 or part of the wall parts 32 are positioned at three locations, namely, the right side, the central side, and the left side. The wall parts 32 are substantially identical to each other in shape. According to the present embodiment, a plurality of light reflecting members 30 may be integrated with reduced influence on the optical characteristic of the individual light reflecting members 30. Accordingly, a light emitting device in which a plurality of light reflecting members 30 is integrated with reduced luminance non-uniformity is provided.

The through hole Z is preferably formed at the boundary of two adjacent ones of the light reflecting members 30. For example, through holes Z1 to Z12 in FIG. 7D are an example of the through hole formed at such a boundary. This can facilitate injecting the adhesive agent 80 into the hollow part Y of the wall parts 32 at the boundary region. Consequently, this can facilitate bonding the outer surfaces of the wall parts 32 of two adjacent ones of the light reflecting members 30 with the adhesive agent 80.

The adhesive agent 80 is preferably provided to be continuously in contact with the inner wall of the hollow part Y and the region W3 at the upper surface of the substrate 10 provided between the peripheral edge of the second opening W2 and the peripheral edge of the first opening W1. Thus, the light reflecting member 30 is fixed to the substrate 10 by the adhesive agent 80 bonding the inner wall of the hollow part Y and the region W3 at the upper surface of the substrate 10 to each other. The adhesive agent 80 can function as an anchor that inhibits displacement of the light reflecting member 30 due to heat expansion and contraction.

As has been described above, the wall parts 32 is provided with the hollow part Y formed with the first opening W1 on the substrate 10 side, the substrate 10 is provided with the through hole Z that penetrates through the substrate 10 in the top-bottom direction and defines the second opening W2 positioned inner than the first opening W1 at the upper surface of the substrate 10, the adhesive agent 80 is provided to be continuously in contact with the inner wall of the hollow part Y and the region W3 at the upper surface of the substrate 10 provided between the peripheral edge of the second opening W2 and the peripheral edge of the first opening W1. In such a case, the light reflecting member 30 is fixed to the substrate 10 with the adhesive agent 80 without using double-sided tape. Thus, there is no concern about light absorption by double-sided tape for fixing the reflecting members. Furthermore, there will be no bright spot caused by the double-sided tape absorbing light and, hence, no luminance non-uniformity associated with the bright spot occurs. Furthermore, in the case in which the interval of the light sources 20 is small also, the bonding strength of the reflecting member to the substrate 10 can be sufficiently reliable. By virtue of the absence of any double-sided tape, the thickness (height) of the light emitting device 3 is reduced by the thickness of the double-sided tape, and the reduced thickness of the light emitting device 3 can be obtained. This can provide the light emitting device 3 with reduced thickness and improved optical characteristics. This is particularly effective in the case in which, for example, the plurality of light emitting devices 3 is used as one unit. A member disposed above the light emitting device 3 can further be supported by a support member such as a pin, and the wall parts 32 and the support member be integrated. In such a case, the strength of the light reflecting member 30 may be improved by the adhesive agent 80 injected into the wall parts 32.

In the case in which the light diffusing member 52 is disposed above or on the upper surface of the light reflecting member 30, irrespective of whether the light diffusing member 52 is supported by any support member such as a pin, light diffused by the light diffusing member 52 (that is, the returning light) can hit the light reflecting member 30. This may cause a bright spot at the wall parts 32 (the lateral surface parts 324) or the top parts 326 of the light reflecting member 30. In the present embodiment, two adjacent ones of the light reflecting members 30 are joined to each other such that the outer surfaces of their respective wall parts 32 are bonded to each other via the adhesive agent 80 but not via a double-sided tape. This allows the shape of the tips of the wall parts 52 (preferably, additionally, the inclination angle of the lateral surface parts 324) to be identical among the plurality of cells (being identical includes the state substantially identical). Accordingly, in the present embodiment, in the case in which the light diffusing member 52 is disposed above or on the upper surface of the light reflecting member 30 also, the plurality of light reflecting members 30 is integrated with reduced influence on the optical characteristic of the individual light reflecting members 30. Therefore, according to the present embodiment, despite the light diffusing member 52 being disposed above or on the upper surface of the light reflecting member 30, a light emitting device in which the plurality of light reflecting members 30 is integrated with reduced luminance non-uniformity may be obtained.

Light Emitting Device 4 According to the Fourth Embodiment

Figure 8A:
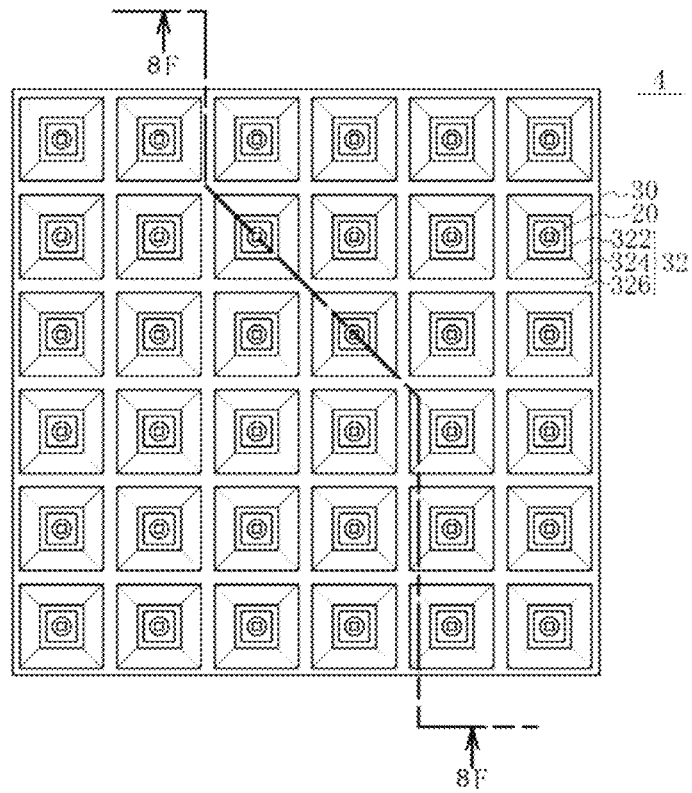
FIG. 8A is a schematic top view of a light emitting device according to a fourth embodiment.
Figure 8B:
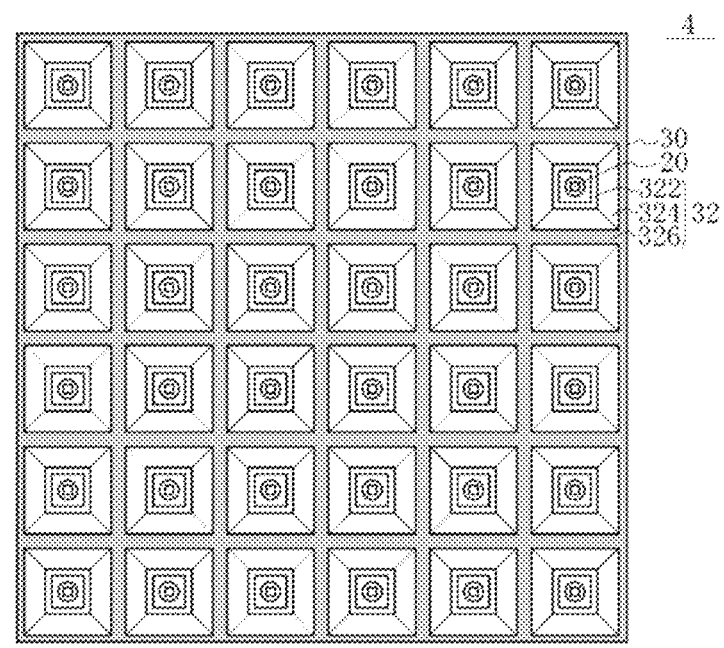
FIG. 8B corresponds to FIG. 8A in which a top part of each wall part is hatched.
Figure 8C:
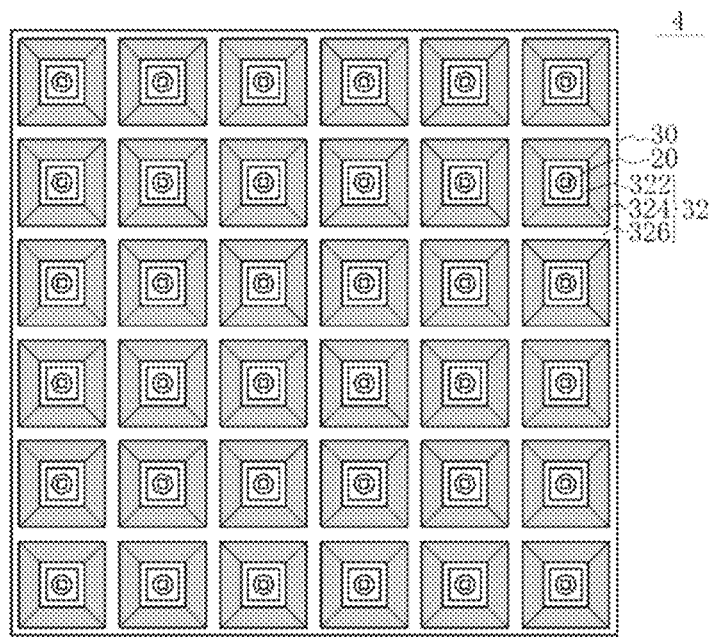
FIG. 8C corresponds to FIG. 8A in which lateral surface parts of each wall part is hatched.
Figure 8D:
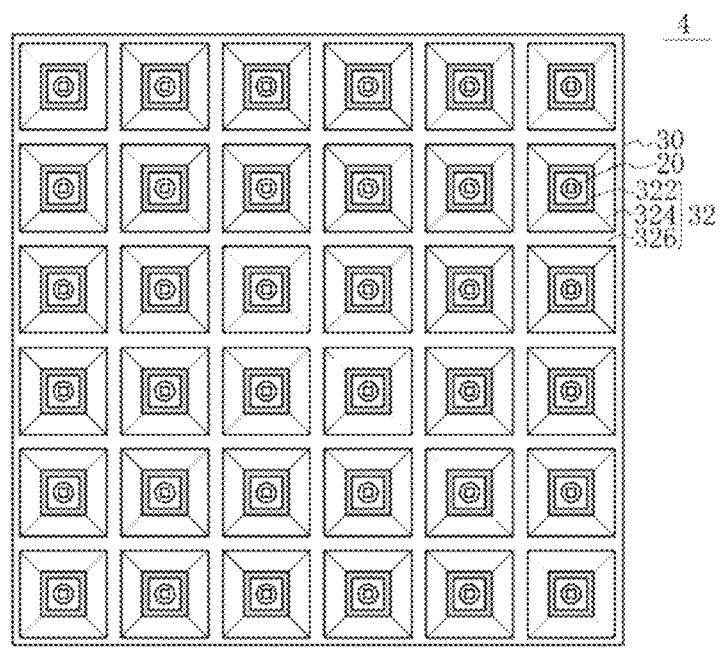
FIG. 8D corresponds to FIG. 8A in which a bottom surface part of each wall part is hatched.
Figure 8E:
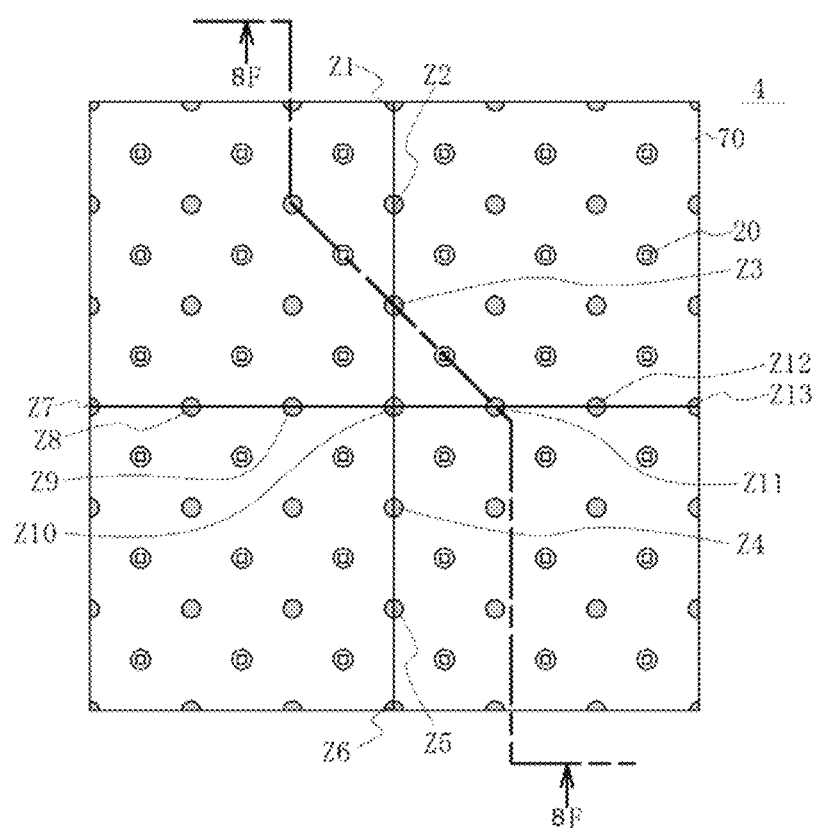
FIG. 8E shows the positional relationship between through holes (second openings) of a substrate and light sources.
Figure 8F:
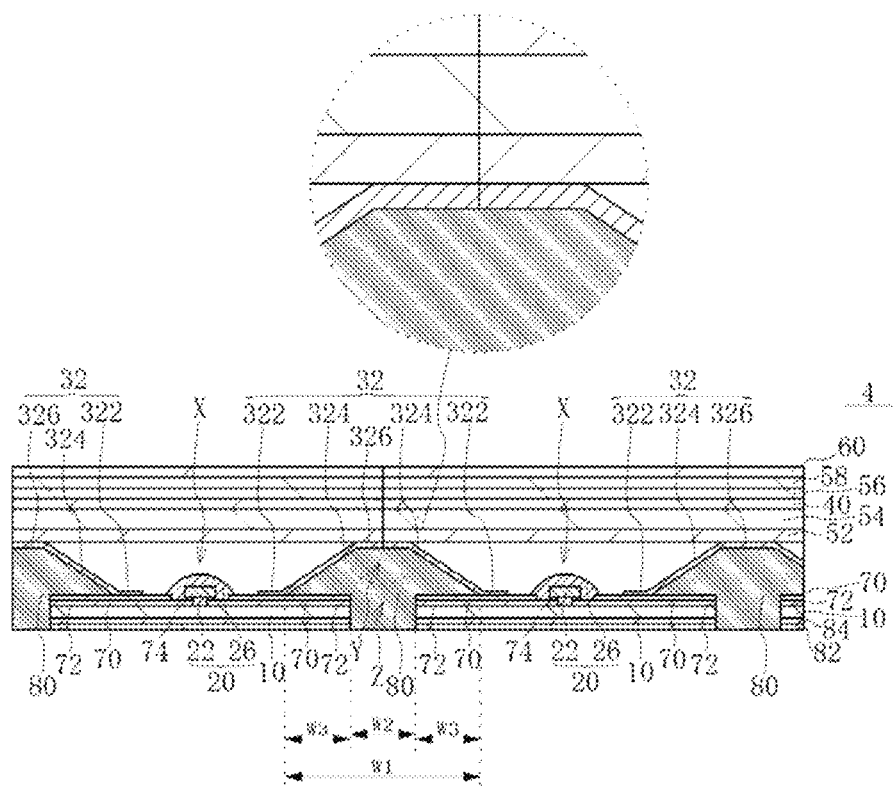
FIG. 8F is a cross-sectional view taken along line 8F-8F in FIG. 8A.

FIG. 8A is a schematic top view of a light emitting device according to a fourth embodiment. FIG. 8B corresponds to FIG. 8A in which the top part of each wall part is hatched. FIG. 8C corresponds to FIG. 8A in which the lateral surface part of each wall part is hatched. FIG. 8D corresponds to FIG. 8A in which the bottom surface part of each wall part is hatched. FIG. 8E shows the relationship between the through holes (the second openings) of the substrate and the light sources without showing the light reflecting member 30 and the adhesive agent 80. FIG. 8F is a cross-sectional view taken along line 8F-8F in FIG. 8A. FIG. 8F also shows members disposed above the light emitting device 3.

As shown in FIGS. 8A to 8F, the light emitting device 4 according to the fourth embodiment is different from the light emitting device 2 according to the second embodiment in that two adjacent ones of the light reflecting members 30 are joined to each other such that the outer surfaces of their respective wall parts 32 are bonded to each other via the adhesive agent 80. The light emitting device 4 according to the fourth embodiment is different from the light emitting device 3 according to the third embodiment in that the top part 326 of the wall parts 32 is in contact with a member disposed above the light emitting device 4 (specifically, the light diffusing member 52). The other structures are the same as or similar to the second and third embodiments and, therefore, a description thereof will be omitted. The light emitting device 4 according to the fourth embodiment can achieve the effect similar to that of the light emitting devices 2, 3 according to the second and third embodiments.

Figure 9A:
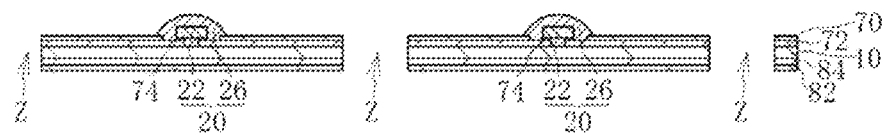
FIG. 9A is a schematic cross-sectional view for illustrating a method of manufacturing the light emitting device according to the third embodiment.
Figure 9B:
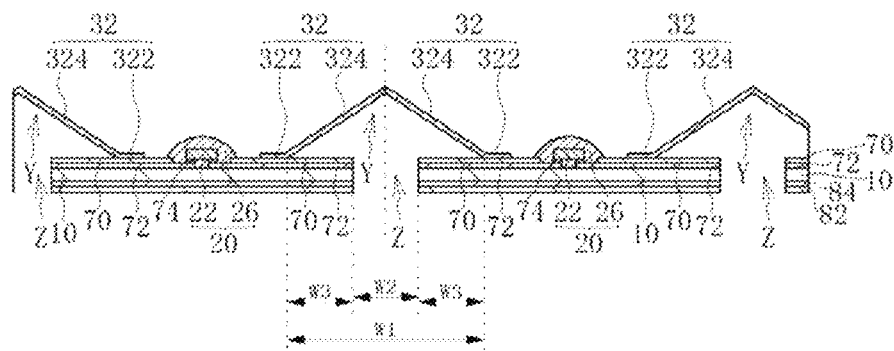
FIG. 9B is a schematic cross-sectional view for illustrating the method of manufacturing the light emitting device according to the third embodiment.
Figure 9C:
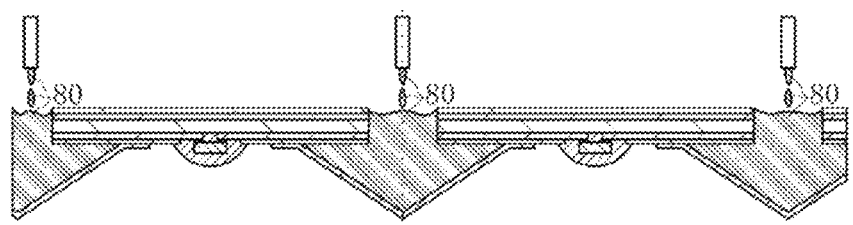
FIG. 9C is a schematic cross-sectional view for illustrating the method of manufacturing the light emitting device according to the third embodiment.

Method of Manufacturing Light Emitting Device 3 According to the Third Embodiment FIGS. 9A to 9D are each a schematic cross-sectional view for illustrating a method of manufacturing the light emitting device according to the third embodiment. In the following, with reference to FIGS. 9A to 9D, a description will be given of the method of manufacturing the light emitting device 3 according to the third embodiment. In FIGS. 9B and 9C, for easier understanding of the joined manner of the plurality of light reflecting members 30, the boundary between two adjacent ones of the light reflecting members 30 is represented by a broken line.

As shown in FIG. 9A, the substrate 10 on which a plurality of light sources 20 is disposed is provided. The substrate 10 is provided with the through hole Z that penetrates through the substrate 10 in the top-bottom direction and defines the second opening W2 positioned inner than the first opening W1 at the upper surface of the substrate 10. The through hole Z can be formed at the substrate 10 after the substrate 10 is provided. Alternatively, the substrate 10 previously provided with the through hole Z can be used.

Subsequently, as shown in FIG. 9B, the light reflecting members 30 including the wall parts 32 each surrounding one of the light sources 20 or two or more of the plurality of light sources 20 are disposed on the substrate 10. The wall parts 32 are provided with, for example, the hollow part Y that is previously formed with the first opening W1 on the substrate 10 side.

Subsequently, as shown in FIG. 9C, setting the lower surface of the substrate 10 oriented upward, the adhesive agent 80 is injected into the hollow part Y of the wall parts 32 through the through hole Z from the lower surface side of the substrate 10. Thus, the adhesive agent 80 is provided to be continuously in contact with the inner wall of the hollow part Y and the region W3 at the upper surface of the substrate 10 provided between the peripheral edge of the second opening W2 and the peripheral edge of the first opening W1.

Figure 9D:
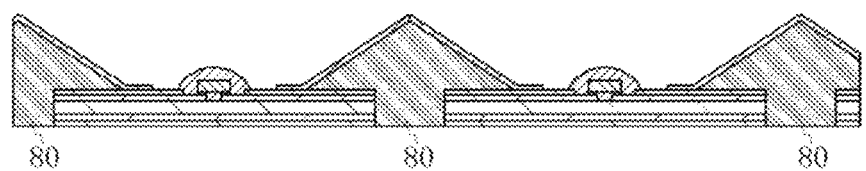
FIG. 9D is a schematic cross-sectional view for illustrating the method of manufacturing the light emitting device according to the third embodiment.

Subsequently, as shown in FIG. 9D, the adhesive agent 80 is cured (or solidified). Thus, the inner wall of the hollow part Y and the region W3 at the upper surface of the substrate 10 provided between the peripheral edge of the second opening W2 and the peripheral edge of the first opening W1 are bonded to each other by the adhesive agent 80, whereby the light reflecting member 30 is fixed to the substrate 10.

Figure 10A:
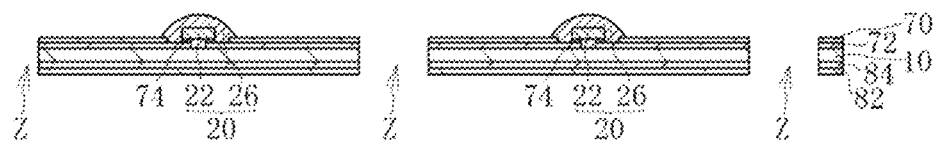
FIG. 10A is a schematic cross-sectional view for illustrating the method of manufacturing the light emitting device according to the fourth embodiment.
Figure 10B:
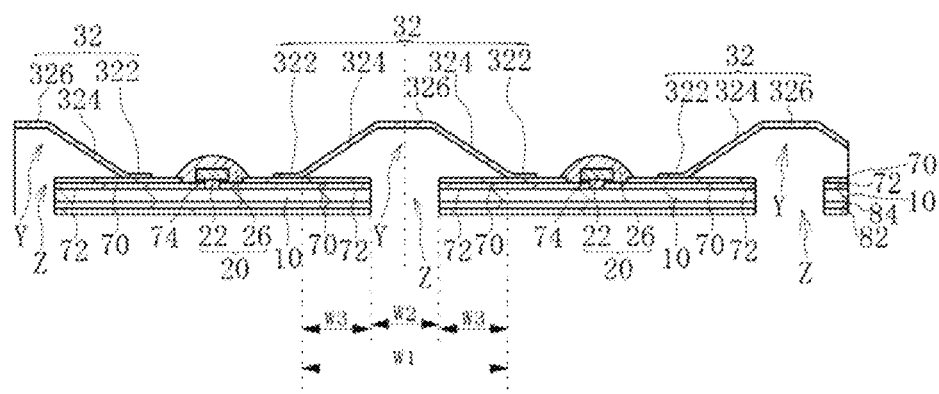
FIG. 10B is a schematic cross-sectional view for illustrating the method of manufacturing the light emitting device according to the fourth embodiment.
Figure 10C:
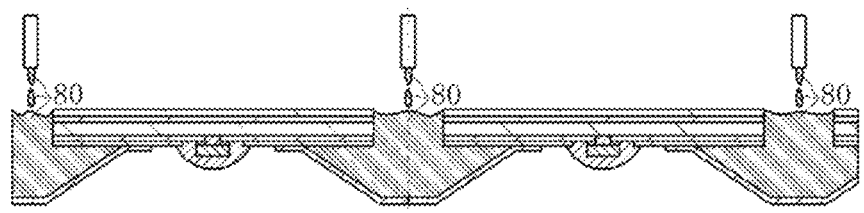
FIG. 10C is a schematic cross-sectional view for illustrating the method of manufacturing the light emitting device according to the fourth embodiment.

Method of Manufacturing Light Emitting Device 4 According to the Fourth Embodiment FIGS. 10A to 10D are each a schematic cross-sectional view for illustrating the method of manufacturing the light emitting device according to the fourth embodiment. In the following, with reference to FIGS. 10A to 10D, a description will be given of the method of manufacturing the light emitting device 4 according to the fourth embodiment. In FIGS. 10B and 10C, for easier understanding of the joined manner of the plurality of light reflecting members 30, the boundary between two adjacent ones of the light reflecting members 30 is represented by a broken line.

Firstly, as shown in FIG. 10A, the substrate 10 on which a plurality of light sources 20 is disposed is provided. The substrate 10 is provided with the through hole Z that penetrates through the substrate 10 in the top-bottom direction and defines the second opening W2 positioned inner than the first opening W1 at the upper surface of the substrate 10. The through hole Z can be formed at the substrate 10 after the substrate 10 is provided. Alternatively, the substrate 10 previously provided with the through hole Z can be provided.

Subsequently, as shown in FIG. 10B, the light reflecting member 30 including the wall parts 32 each surrounding one of the light sources 20 or two or more of the plurality of light sources 20 are disposed on the substrate 10. The wall parts 32 are provided with, for example, the hollow part Y that is previously formed with the first opening W1 on the substrate 10 side.

Subsequently, as shown in FIG. 10C, setting the lower surface of the substrate 10 oriented upward, the adhesive agent 80 is injected into the hollow part Y of the wall parts 32 through the through hole Z from the lower surface side of the substrate 10. Thus, the adhesive agent 80 is provided to be continuously in contact with the inner wall of the hollow part Y and the region W3 at the upper surface of the substrate 10 provided between the peripheral edge of the second opening W2 and the peripheral edge of the first opening W1.

Figure 10D:
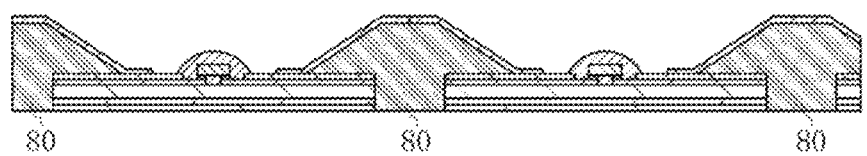
FIG. 10D is a schematic cross-sectional view for illustrating the method of manufacturing the light emitting device according to the fourth embodiment.

Subsequently, as shown in FIG. 10D, the adhesive agent 80 is cured (or solidified). Thus, the inner wall of the hollow part Y and the region W3 at the upper surface of the substrate 10 provided between the peripheral edge of the second opening W2 and the peripheral edge of the first opening W1 are bonded to each other by the adhesive agent 80, whereby the light reflecting member 30 is fixed to the substrate 10.

The light emitting device according to the present disclosure is preferably used as a direct-type backlight device, particularly as a direct-type backlight device that is used for a TV or a monitor.

What is claimed is:

1. A light emitting device comprising:
   a substrate defining a through hole penetrating through the substrate in a thickness direction;
   a plurality of light sources disposed on the substrate;
   a light reflecting member disposed on the substrate and including a wall part having
      a first surface defining a plurality of surrounding parts respectively surrounding each of the light sources individually or two or more of the light sources in groups, and
      a second surface on an opposite side of the first surface and defining a hollow part; and
   a resin member disposed inside the hollow part, wherein
   the hollow part defines a first opening on a substrate side of the wall part,
   the through hole defines a second opening at an upper surface of the substrate, the second opening being positioned inner than the first opening in the top view, and
   the resin member is continuously in contact with the second surface of the wall part defining the hollow part and the upper surface of the substrate in a region between a peripheral edge of the second opening and a peripheral edge of the first opening.

2. The light emitting device according to claim 1, wherein the through hole is connected to the hollow part.

3. The light emitting device according to claim 1, wherein the resin member extends along the upper surface of the substrate from the peripheral edge of the second opening in the top view.

4. The light emitting device according to claim 1, wherein the light reflecting member includes a bottom surface part disposed on the substrate.

5. The light emitting device according to claim 1, wherein the resin member is configured to reflect light emitted from the light sources.

6. The light emitting device according to claim 1, wherein the resin member is configured to absorb light emitted from the light sources.

7. The light emitting device according to claim 1, further comprising
a member disposed above the light reflecting member, wherein
a top part of the wall part of the light reflecting member is in contact with the member disposed above the light reflecting member.

8. The light emitting device according to claim 1, wherein the light sources are arranged at intervals in a range of 5 mm to 25 mm.

9. The light emitting device according to claim 1, wherein the surrounding parts of the wall part are arranged at intervals in a range of 5 mm to 25 mm.

* * * * *